United States Patent
Hughes

(10) Patent No.: US 8,737,043 B2
(45) Date of Patent: May 27, 2014

(54) ELECTRICAL ENCLOSURE

(75) Inventor: Ron Hughes, Thompson, OH (US)

(73) Assignee: Ericson Manufacturing Co., Willoughby, OH (US)

( * ) Notice: Subject to any disclaimer, the term of this patent is extended or adjusted under 35 U.S.C. 154(b) by 253 days.

(21) Appl. No.: 13/415,287

(22) Filed: Mar. 8, 2012

(65) Prior Publication Data

US 2012/0229958 A1    Sep. 13, 2012

Related U.S. Application Data

(60) Provisional application No. 61/451,325, filed on Mar. 10, 2011.

(51) Int. Cl.
*H02B 1/04*    (2006.01)

(52) U.S. Cl.
USPC ........... 361/673; 361/631; 361/634; 361/636; 361/647; 361/652

(58) Field of Classification Search
None
See application file for complete search history.

(56) References Cited

U.S. PATENT DOCUMENTS

| | | | |
|---|---|---|---|
| 2,441,465 A | 5/1948 | Bauroth | |
| 2,530,135 A | 11/1950 | Tornblom | |
| 2,652,482 A | 9/1953 | Bissell | |
| 2,786,936 A | 3/1957 | Appleton | |
| 2,801,768 A | 8/1957 | Immel | |
| 2,814,701 A | 11/1957 | Rayer | |
| 2,964,051 A | 12/1960 | Garnett | |
| 2,985,337 A | 5/1961 | Kleinpeter | |
| 3,016,431 A | 1/1962 | Steigerwald | |
| 3,018,127 A | 1/1962 | Dobrosielski et al. | |
| 3,171,007 A | 2/1965 | Zavertnik | |
| 3,213,270 A | 10/1965 | Appleton et al. | |
| 3,248,508 A | 4/1966 | Pastorel | |
| 3,264,443 A * | 8/1966 | Kelly et al. | 200/331 |
| 3,335,238 A | 8/1967 | Zavertnik et al. | |
| 3,343,042 A | 9/1967 | Cellerini et al. | |

(Continued)

FOREIGN PATENT DOCUMENTS

| | | |
|---|---|---|
| CA | 2373527 | 6/2002 |
| EP | 0531555 | 3/1993 |
| FR | 2622734 | 5/1989 |

OTHER PUBLICATIONS

Arrow Sintered Products Webpage dated Sep. 26, 2004 (Wayback Machine capture).

(Continued)

*Primary Examiner* — Boris Chervinsky
(74) *Attorney, Agent, or Firm* — Calfee, Halter & Griswold LLP

(57) ABSTRACT

A sealed electrical enclosure for housing an electrical component is provided. In one exemplary embodiment, the sealed electrical enclosure includes a housing, a first and second electrical connector, an actuator, and a terminal. The housing has a sealed interior when a top portion is coupled to a bottom portion. The first electrical connector extends from the sealed interior through the bottom of the housing and is electrically coupled to the electrical component. The actuator extends from the sealed interior through the housing and is configured to manipulate the electrical component. The terminal is electrically coupled to the second electrical connector. The second electrical connector is configured to mate with the first electrical connector. The first and second electrical connectors are configured to be connected and disconnected to attach and remove the housing to and from the terminal.

29 Claims, 13 Drawing Sheets

(56) References Cited

U.S. PATENT DOCUMENTS

| | | | |
|---|---|---|---|
| 3,348,103 A | 10/1967 | Berry | |
| 3,410,582 A | 11/1968 | Appleton | |
| 3,486,712 A | 12/1969 | Hoday | |
| 3,490,715 A | 1/1970 | Nicpon | |
| 3,503,034 A | 3/1970 | Appleton | |
| 3,585,323 A | 6/1971 | Appleton et al. | |
| 3,597,726 A | 8/1971 | Appleton et al. | |
| 3,607,604 A | 9/1971 | Nava | |
| 3,617,672 A | 11/1971 | Atakkaan | |
| 3,675,007 A | 7/1972 | Appleton et al. | |
| 3,699,276 A | 10/1972 | Atakkaan | |
| 3,714,415 A | 1/1973 | Stephensen | |
| 3,723,724 A | 3/1973 | Appleton | |
| 3,735,078 A | 5/1973 | Appleton et al. | |
| 3,743,800 A | 7/1973 | Appleton et al. | |
| 3,829,815 A | 8/1974 | Rutkowski | |
| 3,857,574 A | 12/1974 | Artzer | |
| 3,888,723 A | 6/1975 | Artzer | |
| 3,927,249 A | 12/1975 | Pearse | |
| 3,986,081 A | 10/1976 | Norden | |
| 3,991,905 A | 11/1976 | Nicpon | |
| 4,032,209 A | 6/1977 | Rutkowski | |
| 4,034,170 A | 7/1977 | Raabe et al. | |
| 4,037,316 A * | 7/1977 | Stoll | 29/622 |
| 4,062,653 A | 12/1977 | Falckenberg et al. | |
| 4,065,653 A | 12/1977 | Jones | |
| 4,074,941 A | 2/1978 | Jablonski | |
| RE29,780 E | 9/1978 | Rutkowski | |
| 4,156,121 A | 5/1979 | Klein et al. | |
| 4,180,177 A | 12/1979 | Gunderman et al. | |
| 4,190,222 A | 2/1980 | Appleton et al. | |
| 4,260,863 A | 4/1981 | Appleton | |
| 4,362,284 A | 12/1982 | Bolante | |
| 4,390,114 A | 6/1983 | Sviatoslavsky et al. | |
| 4,391,480 A | 7/1983 | Mina | |
| 4,490,576 A | 12/1984 | Bolante et al. | |
| 4,543,455 A | 9/1985 | Pollerspock | |
| 4,553,000 A | 11/1985 | Appleton | |
| 4,620,061 A * | 10/1986 | Appleton | 174/51 |
| 4,664,281 A | 5/1987 | Falk et al. | |
| 4,717,987 A | 1/1988 | Newmark et al. | |
| 4,717,989 A | 1/1988 | De Barros et al. | |
| 4,738,636 A | 4/1988 | Bolante | |
| 4,783,718 A | 11/1988 | Raabe et al. | |
| 4,791,541 A | 12/1988 | Simmons | |
| 4,841,418 A | 6/1989 | Davis | |
| 4,842,548 A | 6/1989 | Bolante | |
| 4,894,632 A | 1/1990 | Castonguay et al. | |
| 4,912,599 A | 3/1990 | Wittmer | |
| 4,913,503 A | 4/1990 | Castonguay et al. | |
| 4,914,262 A | 4/1990 | Appleton | |
| 4,945,450 A | 7/1990 | Sabatella et al. | |
| 4,965,414 A | 10/1990 | Sobotka, Jr. et al. | |
| 4,965,544 A | 10/1990 | Kelaita, Jr. et al. | |
| 4,978,816 A | 12/1990 | Castonguay et al. | |
| 5,043,853 A | 8/1991 | Rutledge | |
| 5,068,494 A | 11/1991 | Bolante | |
| 5,070,361 A | 12/1991 | Magnon et al. | |
| 5,101,082 A | 3/1992 | Simmons et al. | |
| 5,121,564 A | 6/1992 | Story | |
| 5,126,918 A | 6/1992 | Morby et al. | |
| 5,151,564 A | 9/1992 | Rowe | |
| 5,172,300 A * | 12/1992 | Morby et al. | 361/637 |
| 5,202,538 A | 4/1993 | Skirpan | |
| 5,209,420 A | 5/1993 | Simmons et al. | |
| 5,212,624 A | 5/1993 | Johnson et al. | |
| 5,260,531 A | 11/1993 | Yarbrough et al. | |
| 5,272,296 A | 12/1993 | Robarge et al. | |
| 5,286,935 A | 2/1994 | Mina et al. | |
| 5,286,936 A | 2/1994 | Hatekeyama | |
| 5,300,863 A | 4/1994 | Mayer | |
| 5,334,939 A | 8/1994 | Yarbrough | |
| 5,351,165 A | 9/1994 | Hancock | |
| 5,358,429 A | 10/1994 | Mina | |
| 5,386,429 A | 1/1995 | Naito et al. | |
| 5,410,446 A | 4/1995 | Wright et al. | |
| 5,414,584 A | 5/1995 | Young | |
| 5,439,396 A * | 8/1995 | Magdaleno | 439/716 |
| 5,457,296 A | 10/1995 | Neill et al. | |
| 5,540,790 A | 7/1996 | Erickson | |
| 5,569,042 A | 10/1996 | Mosebach | |
| 5,597,991 A | 1/1997 | Chen et al. | |
| 5,607,047 A | 3/1997 | Leet et al. | |
| 5,634,553 A | 6/1997 | Hopper et al. | |
| 5,661,265 A | 8/1997 | Yarbrough et al. | |
| 5,663,862 A | 9/1997 | Hopping-Mills | |
| 5,670,763 A | 9/1997 | Spencer | |
| 5,678,866 A | 10/1997 | Mina | |
| 5,686,708 A | 11/1997 | Spencer | |
| 5,717,182 A | 2/1998 | Mina et al. | |
| 5,721,667 A | 2/1998 | Rose | |
| 5,753,878 A | 5/1998 | Doughty et al. | |
| 5,767,440 A | 6/1998 | Byron et al. | |
| 5,796,061 A | 8/1998 | Fabrizi et al. | |
| 5,821,695 A | 10/1998 | Vilanilam et al. | |
| 5,838,219 A | 11/1998 | Du et al. | |
| 5,857,563 A | 1/1999 | Helmer et al. | |
| 5,870,278 A | 2/1999 | Girard et al. | |
| 5,880,400 A | 3/1999 | Leischner et al. | |
| 5,880,401 A | 3/1999 | Leischner et al. | |
| 5,886,868 A | 3/1999 | White et al. | |
| 5,894,404 A | 4/1999 | Vrnak et al. | |
| 5,902,973 A | 5/1999 | Ramey et al. | |
| 5,911,316 A | 6/1999 | Chu | |
| 5,936,214 A | 8/1999 | Phillips | |
| 5,969,587 A | 10/1999 | Combas | |
| 5,998,750 A | 12/1999 | Wegener et al. | |
| 6,040,543 A | 3/2000 | Mina et al. | |
| 6,069,447 A | 5/2000 | Vilanilam et al. | |
| 6,086,522 A | 7/2000 | Hechler | |
| 6,087,609 A | 7/2000 | Thilker et al. | |
| 6,100,481 A | 8/2000 | Castonguay et al. | |
| 6,147,298 A | 11/2000 | Mina et al. | |
| 6,198,631 B1 * | 3/2001 | Radosavljevic et al. | 361/704 |
| 6,229,692 B1 | 5/2001 | Stendardo et al. | |
| 6,354,851 B1 | 3/2002 | Bachle | |
| 6,372,983 B1 | 4/2002 | Knaggs | |
| 6,377,144 B1 | 4/2002 | Castonguay et al. | |
| 6,456,485 B1 * | 9/2002 | Bader et al. | 361/673 |
| 6,488,540 B2 * | 12/2002 | Coyle et al. | 439/650 |
| 6,674,031 B1 * | 1/2004 | Flegel | 200/297 |
| 6,680,842 B1 * | 1/2004 | Pelaez et al. | 361/631 |
| 6,838,962 B2 | 1/2005 | Leone et al. | |
| D513,969 S | 1/2006 | Schurr et al. | |
| 6,989,996 B2 | 1/2006 | Wells et al. | |
| 7,073,971 B2 | 7/2006 | Schurr et al. | |
| D529,453 S | 10/2006 | Schurr et al. | |
| 7,400,239 B2 | 7/2008 | Kiko et al. | |
| 7,633,011 B2 | 12/2009 | Bolante | |
| 7,907,389 B2 | 3/2011 | Baird et al. | |
| 8,017,881 B2 * | 9/2011 | Simmons | 200/293 |
| 8,093,974 B2 * | 1/2012 | Nagura et al. | 335/201 |
| 2004/0045796 A1 | 3/2004 | Azzola et al. | |
| 2004/0149550 A1 | 8/2004 | Allen | |
| 2004/0196640 A1 | 10/2004 | Wells et al. | |
| 2006/0291148 A1 | 12/2006 | Kelly et al. | |
| 2007/0180717 A1 | 8/2007 | Kopp | |
| 2008/0100993 A1 | 5/2008 | Muller et al. | |
| 2008/0110660 A1 | 5/2008 | Bolante | |
| 2012/0181154 A1 * | 7/2012 | Ho et al. | 200/293 |

OTHER PUBLICATIONS

International Search Report and Written Opinion from PCT/US12/28175 dated Jul. 5, 2012.

* cited by examiner

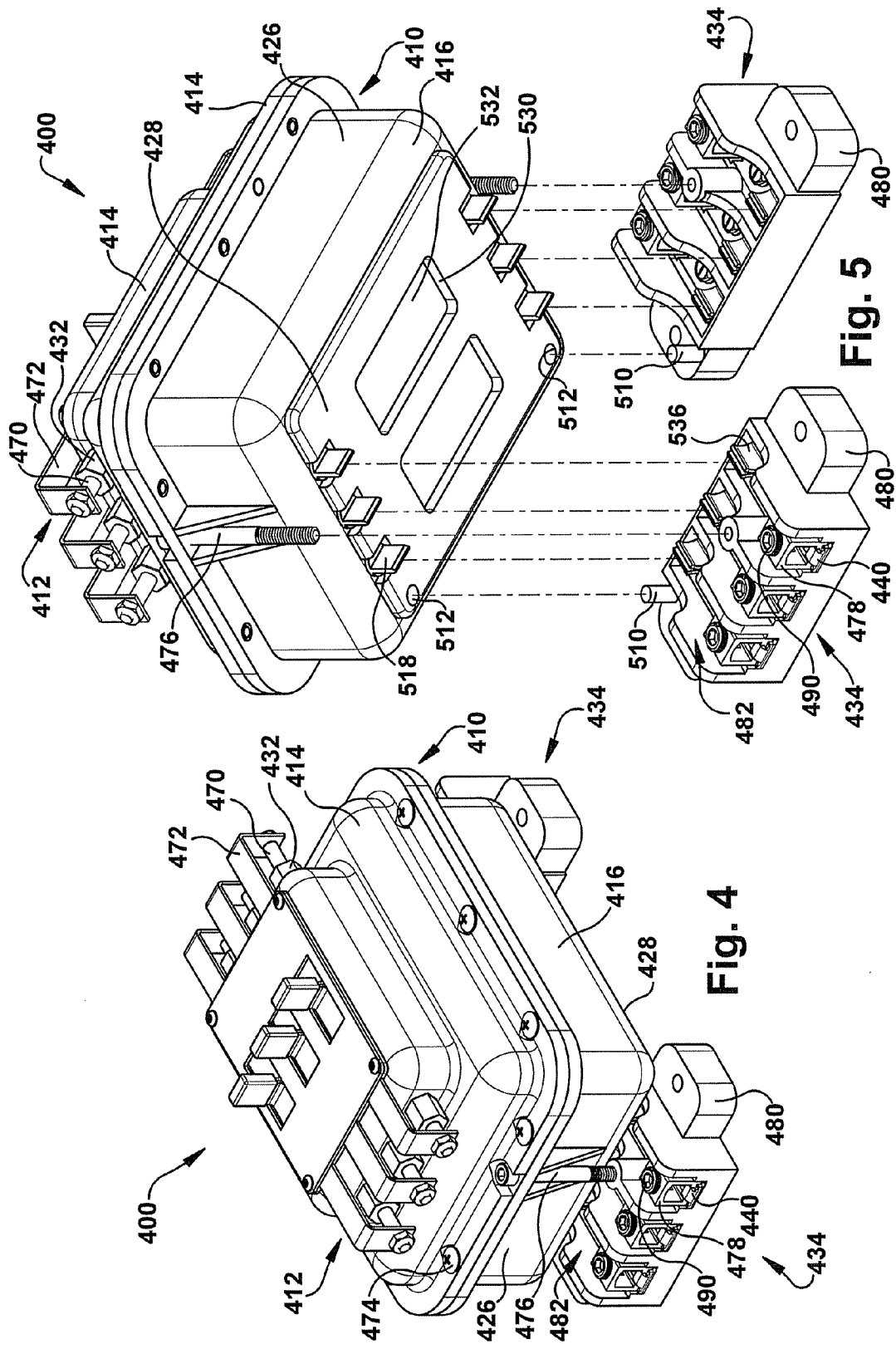

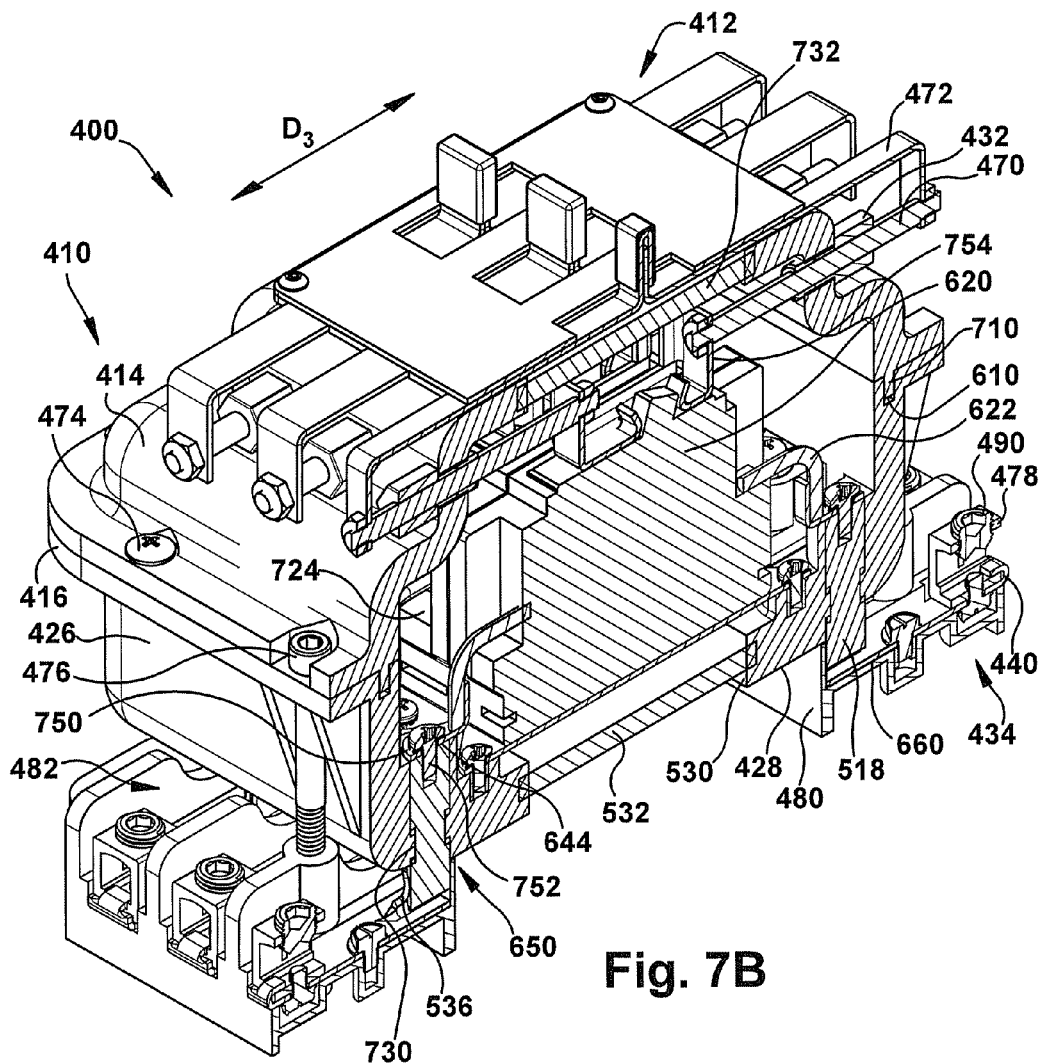
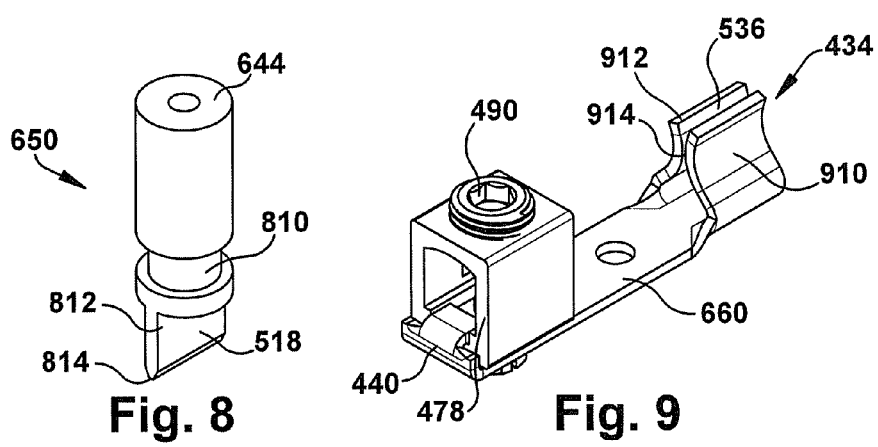
Fig. 7B
Fig. 8  Fig. 9

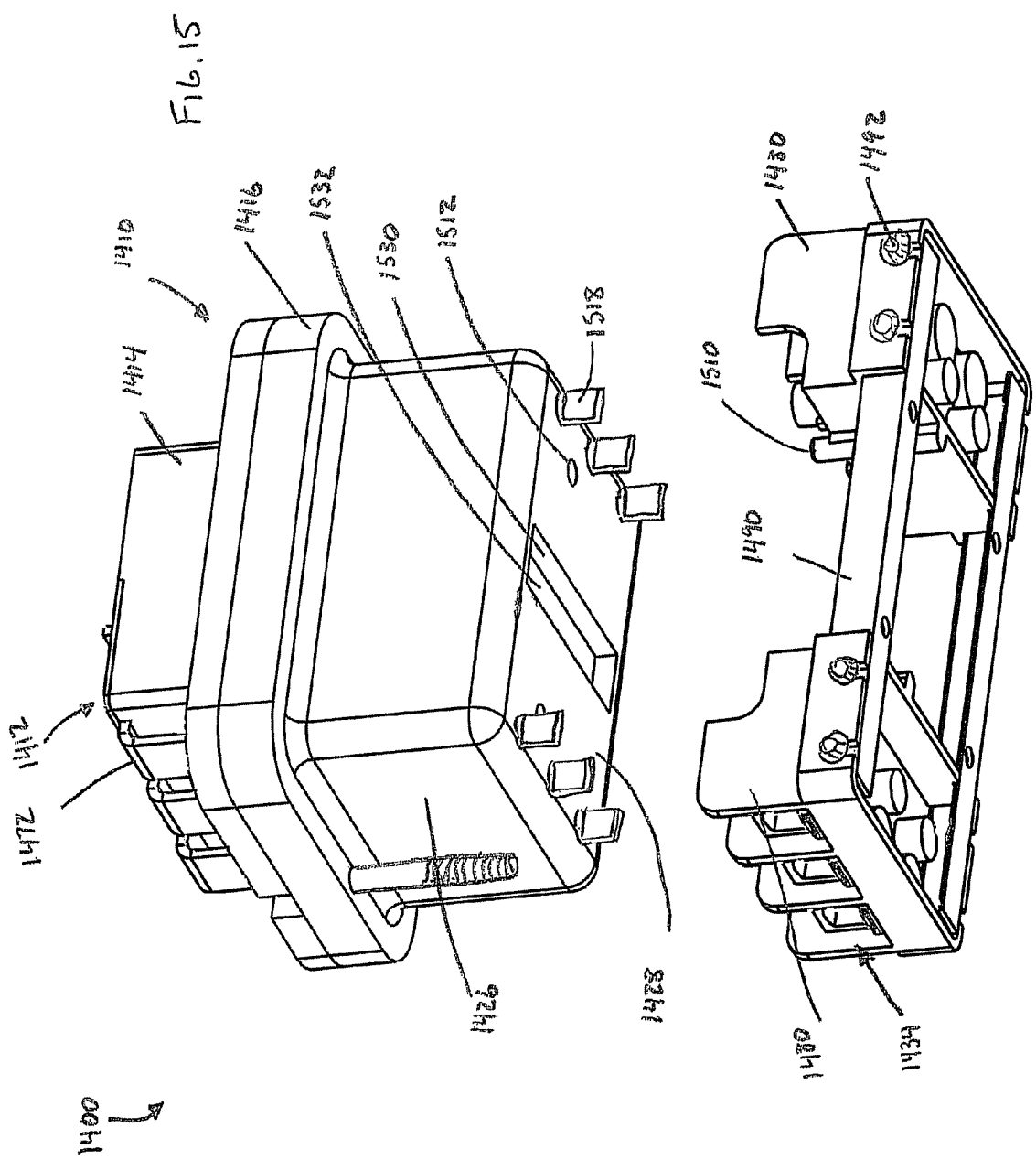

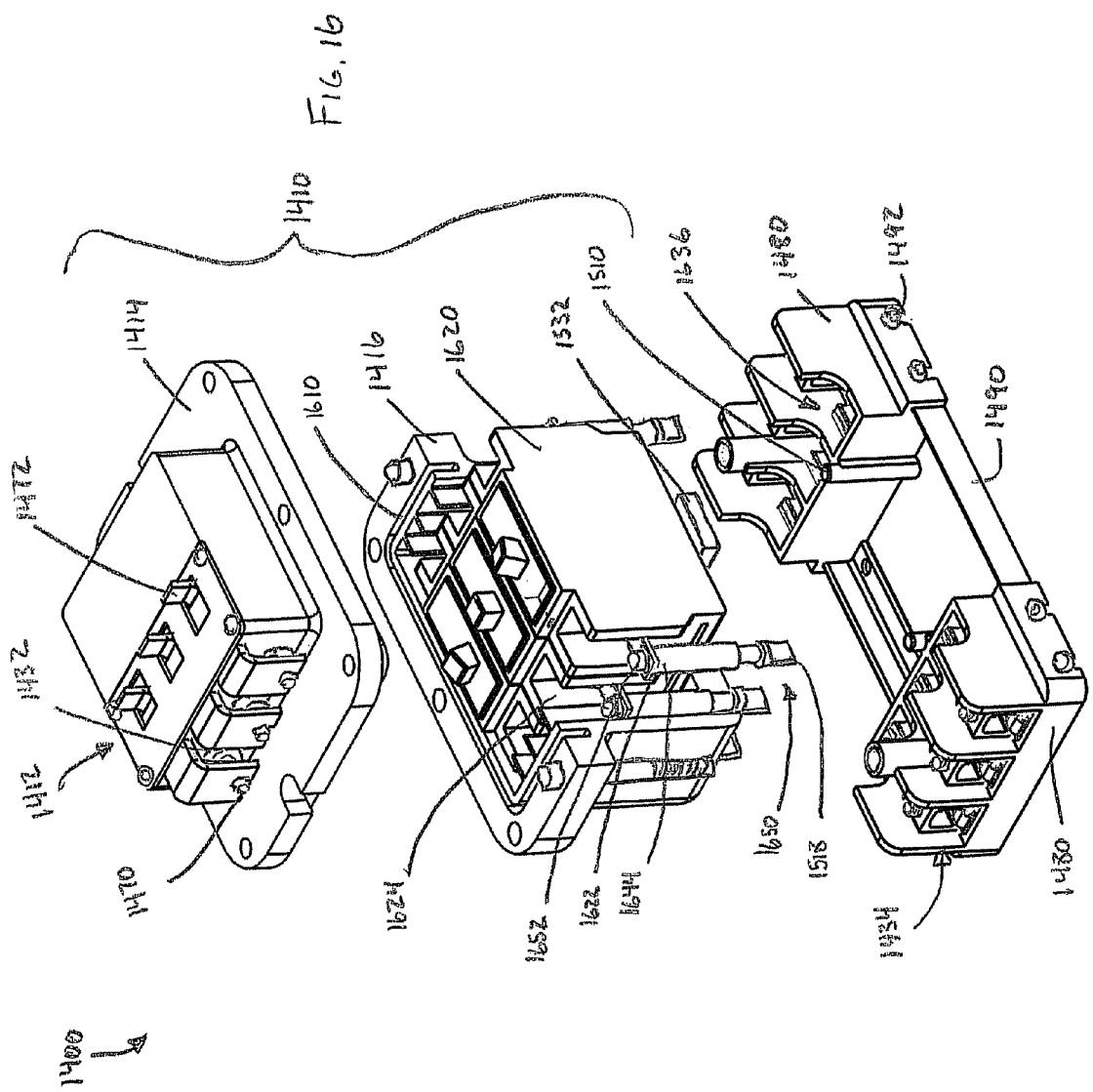

ELECTRICAL ENCLOSURE

CROSS REFERENCE TO RELATED APPLICATION

This application is a U.S. Non-Provisional patent application which claims priority to U.S. Provisional Patent Application No. 61/451,325, filed on Mar. 10, 2011 and titled "Electrical Enclosure," which is hereby incorporated by reference in its entirety.

FIELD OF THE INVENTION

The invention of the present application relates to an enclosure for electrical equipment and/or components. More specifically, one exemplary embodiment of the invention described in the present application relates to a sealed electrical enclosure for use in hazardous environments.

BACKGROUND

The National Electrical Code (NEC) defines hazardous locations as those areas where fire or explosion hazards may exist due to flammable gases or vapors, flammable liquids, combustible dust, or ignitable fibers or flyings. Electrical equipment and/or electrical components can sometimes be a source of ignition in these volatile areas. To protect against such ignition, enclosures are often used to house electrical equipment and/or electrical components located in volatile areas. These enclosures are often made of heavy cast metal and are bolted shut. Electrical equipment or components housed in an enclosure often require maintenance or must be replaced. When this occurs, an electrician or maintenance person is often exposed to the hazardous environment for extended periods of time. Further, the enclosure may be located in areas that are difficult to access and may be exposed to harsh climatic conditions.

SUMMARY

A sealed electrical enclosure for housing an electrical component is disclosed by the present application. In one exemplary embodiment, the sealed electrical enclosure includes a housing, a first and second electrical connector, an actuator, and a terminal. The housing includes a top portion removably coupled to a bottom portion. The bottom portion of the housing includes a plurality of sidewalls extending from a bottom. The housing has a sealed interior when the top portion is coupled to the bottom portion. The first electrical connector extends from the sealed interior through the bottom of the housing. The first electrical connector is electrically coupled to the electrical component housed within the electrical enclosure and forms a first seal with the bottom of the housing. The actuator extends from the sealed interior through the housing. The actuator is configured to manipulate the electrical component and forms a second seal with the housing. The terminal is configured for attachment of a wire and is electrically coupled to the second electrical connector. The second electrical connector is configured to mate with the first electrical connector to form an electrical connection between the wire and the electrical component. The first and second electrical connectors are configured to be connected and disconnected to attach and remove the housing to and from the terminal without removing the wire from the terminal.

In another exemplary embodiment, the sealed electrical enclosure includes a housing, an electrical connector, an actuator, and a terminal. The housing has a top portion removably coupled to a bottom portion. The bottom portion of the housing has a plurality of sidewalls extending from a bottom. The housing has a sealed interior when the top portion is coupled to the bottom portion. The electrical connector extends from the sealed interior through the bottom of the housing. The electrical connector is electrically coupled to the electrical component housed within the electrical enclosure and forms a first seal with the bottom of the housing. The actuator extends from the sealed interior through the housing. The actuator is configured to manipulate the electrical component and forms a second seal with the housing. The terminal has a first end and a second end. The first end of the terminal is configured for attachment of a wire. The second end of the terminal is configured for attachment to the electrical connector. The terminal and the electrical connector form an electrical connection between the wire and the electrical component. The terminal is configured to extend outward from underneath the bottom of the housing and past a sidewall of the housing such that the first end of the terminal is accessible for attachment of the wire. The terminal is configured such that an outer surface of the second end contacts an exposed end of the electrical connector below at least a portion of the bottom of the housing. The terminal is removably coupled to the electrical connector.

BRIEF DESCRIPTION OF THE DRAWINGS

In the accompanying drawings which are incorporated in and constitute a part of the specification, embodiments of the invention are illustrated, which, together with a general description of the invention given above, and the detailed description given below, serve to example the principles of this invention.

FIG. 4 is a top perspective view of one embodiment of an electrical enclosure of the present application.

FIG. 5 is a bottom perspective view of the electrical enclosure of FIG. 4 illustrating one embodiment of a housing removed from a plurality of terminals of the present application.

FIG. 7B is a cross sectional perspective view of the electrical enclosure of FIG. 4 illustrating one embodiment of a housing attached to a plurality of terminals of the present application.

FIG. 8 is a perspective view of one embodiment of an electrical connector of the present application.

FIG. 9 is a perspective view of one embodiment of a terminal of the present application.

FIG. 15 is a bottom perspective view of the electrical enclosure of FIG. 14 illustrating one embodiment of a housing removed from a plurality of terminals of the present application.

FIG. 16 is an exploded and partial cross sectional perspective view of the electrical enclosure of FIG. 14 of the present application.

DESCRIPTION OF EMBODIMENTS

The electrical enclosure of the present application is generally configured for use in a hazardous location. In one aspect, the electrical enclosure is sealed such that the electrical equipment or components housed within the enclosure are not exposed to the hazardous environment. As used in this application, a sealed enclosure is an enclosure that is flame or explosion proof in that it does not permit any open flames or sparks generated by the components housed therein to ignite external flammable gases or vapors, flammable liquids, combustible dust, or ignitable fibers or flyings. A sealed enclosure may include one or more vents that permit heat and pressure to escape from the interior of the enclosure, but still prohibit internal open flames or sparks generated by the components housed within the enclosure from propagating to the hazardous external environment. As used herein, the term electrically coupled or electrically connected means direct or indirect coupling by any form of electricity transmission including through the use of rigid, non-rigid, metallic, or non-metallic conductive materials.

Figure 1:
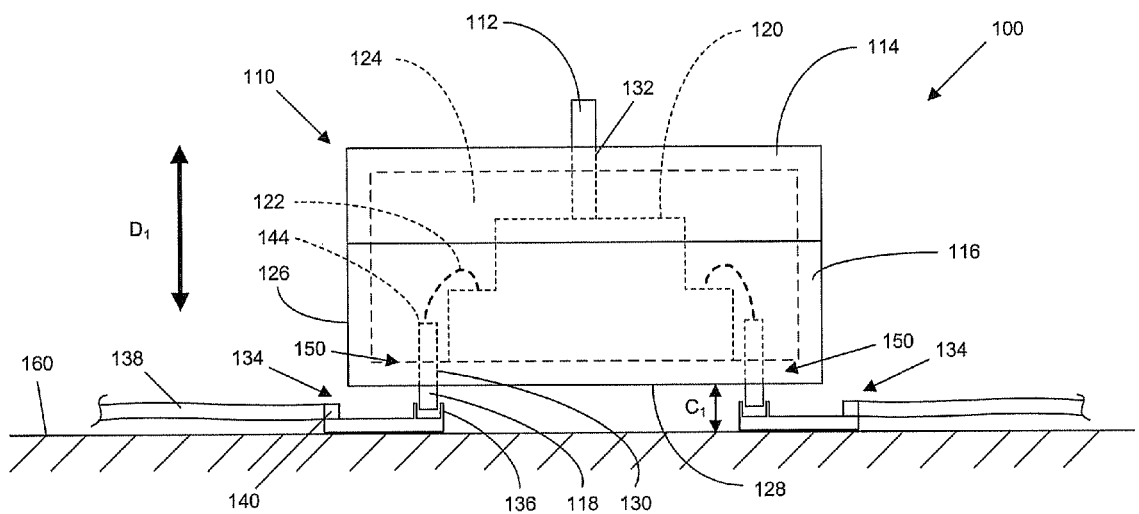
FIG. 1 is a side elevational view of one embodiment of an electrical enclosure of the present application.

FIG. 1 illustrates a sealed electrical enclosure 100 according to an embodiment of the present application. As illustrated, the electrical enclosure 100 comprises a housing 110 and one or more electrical components 120, actuators 112, electrical connectors 150 and 136, and terminals 134. The electrical enclosure 100 is configured such that the housing 110 may be manually removed from, or attached to, the one or more terminals 134 without having to remove one or more wires attached to the one or more terminals. In this regard, the connection between the housing 110 and the one or more terminals 134 is a quick connect/disconnect. Further, the housing 110 is made of a lighter weight material than conventional cast metal enclosures. As such, the housing 110 may be quickly and easily removed by one person and transported to a separate location for maintenance, repair, and/or replacement of the electrical enclosure 100 or the components thereof.

As illustrated in FIG. 1, the housing 110 of the electrical enclosure 100 includes a top portion 114 removably coupled to a bottom portion 116 to form a sealed interior cavity 124 of the housing. The top portion 114 of the housing 110 may be removably coupled to the bottom portion 116 by various means, e.g., with one or more bolts, clips, or other removable fasteners. The housing 110 may include a seal or joint between the top portion 114 and the bottom portion 116 to prohibit open flames or sparks generated by the one or more components 120 housed within the enclosure 100 from propagating to the hazardous environment. One exemplary seal or joint is commonly referred to as a labyrinth seal, although other types of seals or joints may be used. As shown in FIG. 1, the bottom portion 116 of the housing 110 includes two sets of opposing sidewalls 126 extending vertically upward from a bottom 128. The housing 110 may be made from a variety of materials, such as plastic or metal. As shown, at least the bottom portion 116 of the housing 110 is made of molded plastic. Manufacturing the housing 110 from plastic reduces the weight of the housing as compared to a housing made from cast metal.

Mounted within the housing 110 of the electrical enclosure 100 is one or more electrical components 120. The one or more electrical components 120 may include a variety of components or combination of components, such as a switch, circuit breaker, relay, controller, resistor, capacitor, transistor, power source, or other electrical component. The one or more electrical components 120 may be mounted within the housing 110 by various means, such as with screws, bolts, clips, or other fasteners. The one or more electrical components 120 may include a mounting means, such as a flange or bracket, to facilitate mounting of the component within the housing 110. Further, the interior of the housing 110 may include mounting areas, such as bosses, protrusions, or flat areas, to facilitate mounting of the component 120 within the housing.

One or more first electrical connectors 150 of the electrical enclosure 100 extend from the sealed interior 124 of the housing 110 through the bottom 128 of the housing. A first end 144 of the first electrical connector 150 is accessible within the sealed interior 124 of the housing 110 and is configured to be electrically coupled to one or more electrical component 120 mounted within the housing. A second or exposed end 118 of the first electrical connector 150 extends below at least a portion of the bottom surface of the housing 110 and is configured to form a first part of a removable connection between the housing 110 and the one or more terminals 134. The first electrical connector 150 also forms a seal 130 with the bottom 128 of the housing 110 to prohibit open flames or sparks generated by the one or more components 120 housed within the enclosure 100 from propagating to the hazardous environment.

The first electrical connector 150 acts as a conductor to transmit electricity between the terminal 134 and the electrical component 120 mounted within the housing 110. The first electrical connector 150 may be made from one or more pieces of conductive material. The first electrical connector 150 may also be rigid, non-rigid, metallic, non-metallic, shielded, or unshielded. For example, in one embodiment, the first electrical connector 150 is configured as a rigid piece of metallic conductive material (e.g., copper, silver, or aluminum) that is integrally molded with the bottom portion 116 of the housing 110 (e.g., the bottom portion of the housing is molded around the first electrical connector). The seal 130 is formed between the first electrical connector 150 and the bottom portion 116 of the housing 110 by molding the bottom portion around the connector. However, in other embodiments, the seal 130 between the first electrical connector 150 and the housing 110 may include a separate component, such as a flexible insert, configured to seal the connector with the housing.

The first end 144 of the first electrical connector 150 may include a fastening means to facilitate coupling the first electrical connector to the electrical component 120, such as a screw, clip, pin, or the like. The first electrical connector 150 may also be electrically coupled, either directly or indirectly, to the electrical component 120 by various means, such as with a wire or a flexible or non-flexible piece of conductive material.

The one or more terminals 134 of the electrical enclosure 100 are configured to transmit electricity between one or more wires 138 and the one or more first electrical connectors 150. A first end 140 of the terminal 134 is configured for attachment of the wire 138. The first end 140 of the terminal 134 may be configured in a variety of ways to electrically couple the wire 138 to the terminal. For example, in one embodiment, the first end 140 of the terminal 134 includes a wire connecting means, such as a plate or housing made of conductive material and configured to receive an end of the wire 138 or a connector attached to the end of the wire. A fastening means, such as a screw, bolt, clip, or the like, may be used to hold the wire 138 or connector in contact with the wire connecting means.

The first end 140 of the one or more terminals 134 is electrically coupled to one or more second electrical connectors 136. The second electrical connector 136 is configured to mate with the first electrical connector 150 to form an electrical connection between the wire 138 and the electrical component 120. The second electrical connector 136 may be integrally formed with at least a portion of the terminal 134, or it may be a separate component from the terminal. For example, in one embodiment, the second electrical connector 136 and at least a portion of the wire connecting means of the terminal 134 are formed from a unitary piece of conductive material. The second electrical connector 136 may be positioned at or near a second end of the terminal 134 opposite the first end 140 of the terminal. In another embodiment, the second electrical connector 136 is a separate component from the wire connecting means and is electrically coupled to the wire connecting means by one or more pieces of conductive material.

The second electrical connector 136 forms a second part of the removable connection between the housing 110 and the one or more terminals 134. In this regard, the second electrical connector 136 is configured to mate with the second or exposed end 118 of the first electrical connector 150 that extends below at least a portion of the bottom surface of the housing 110. The first electrical connector 150 is configured to be frictionally connected to the second electrical connector 136 to attach the housing 110 to the terminal 134. The removable connection formed by the first electrical connector 150 and the second electrical connector 136 may be positioned underneath at least a portion of the bottom surface of the housing (e.g., not extending out from underneath the housing past a sidewall of the housing). As such, at least the housing 110 and the first end 140 of the terminal 134 protect the removable connection from damage. Further, the first electrical connector 150 and the second electrical connector 136 are configured such that the first electrical connector may be disconnected from the second electrical connector by pulling the housing in a direction $D_1$ away from the terminal 134. As such, the first electrical connector 150 and the second electrical connector 136 are configured such that they may be connected and disconnected without the use of tools.

In one embodiment, the second end 118 of the first electrical connector 150 does not extend entirely beneath the bottom surface of the housing 110. Instead, the second end 118 of the first electrical connector 150 is positioned at least partially within a cavity formed in the bottom 128 of the housing 110. The cavity is shaped and configured such that the second electrical connector 136 is capable of mating with the second end 118 of the first electrical connector 150 at least partially positioned within the cavity. The cavity further protects the removable connection from damage.

The removable connection formed by the first and second electrical connectors 150 and 136 may be shaped and configured in a variety of ways. For example, in one embodiment, the first electrical connector 150 includes a substantially vertical plate having a wedge shaped end. The vertical plate extends outward from the bottom 128 of the housing 110 and is configured to mate with a clip portion of the second electrical connector 136. However, other configurations of the removable connection are envisioned. For example, the first electrical connector may be a pin configured to mate with a sleeve of the second electrical connector.

Further, the housing 110 and/or the one or more terminals 134 of the electrical enclosure 100 may include a locating means configured to facilitate attachment of the housing to the one or more terminals in a correct orientation. For example, in one embodiment, the one or more terminals 134 comprise one or more upward protruding pins shaped and configured to mate with one or more openings in the bottom 128 of the housing 110. When the housing 110 is in a correct orientation relative to the one or more terminals 134, the pin is aligned with the opening and may be received in the opening such that the housing may be attached to the one or more terminals. However, other shapes and configurations of the locating means are envisioned. For example, in one embodiment, plates or walls extend upward from the one or more terminals 134 and are configured to mate with one or more openings (e.g., slots) in the bottom 128 of the housing 110.

In one exemplary embodiment, the first and second electrical connectors 150 and 136 are shaped and configured such that they may transmit between about 100 and 600 volts of electricity having a current between about 10 and 100 amperes from the wire 138 to the electrical component 120. Further, the first and second electrical connectors 150 and 136 may be shaped and configured such that the temperature of the connectors does not increase by more than about 30 degrees Celsius when electricity having a current between about 10 and 100 amperes is transmitted from the wire 138 to the electrical component 120.

One or more actuators 112 extend from the sealed interior 124 through the housing 110. The one or more actuators 112 are configured to manipulate the one or more electrical components 120 (e.g., a switch of a circuit breaker). The moveable actuator 112 also forms a seal 132 with the housing 110. The actuator 112 may extend through the top portion 114 and/or the bottom portion 116 of the housing 110 in one or more locations. For example, in one embodiment, an actuating rod extends through the top portion 114 of the housing 110 and is operatively coupled to a circuit breaker mounted within the housing 110. Sliding the actuating rod back and forth and/or rotating the actuating rod manipulates the circuit breaker.

The actuator 112 may be shaped and configured in a variety of ways. For example, as mentioned above, the moveable actuator 112 may be configured as an actuating rod extending through the housing 110 and movable relative to the housing to manipulate the electrical component 120. The actuating rod may be slidable and/or rotatable relative to the housing 110 to manipulate the electrical component 120. A first portion of the actuating rod may be operatively coupled to the electrical component 120 housed within the sealed interior 124 of the housing 110. A second portion of the actuating rod may be operatively coupled to an operating means, such as a knob, a switch, a lever, or the like, located exterior to the sealed interior 124 of the housing 110. As such, the operating means is exposed such that it may be used to manipulate the electrical component 120 without having to open the housing 110.

The seal 132 between the actuator 112 and the housing 110 may be formed in a variety of ways. For example, in one embodiment, an insert is positioned between an actuating rod of the actuator 112 and the housing 110. The insert includes an external sealing surface and an internal sealing surface. The external sealing surface of the insert is shaped and configured to form a seal with an internal surface of an opening in the housing 110. The internal sealing surface of the insert is shaped and configured to form a seal with an external surface of the actuating rod as the rod is moved relative to the housing 110. The insert is also shaped and configured such that it is held stationary relative to the housing 110 as the actuating rod is moved relative to the housing. The insert may be flexible or non-flexible, and may be made from a variety of materials, such as bronze or stainless steel.

The electrical enclosure 100 may optionally include one or more safety means for securing the housing 110 to the one or more terminals 134. For example, one or more removable bolts, screws, clips, bands, or other fasteners may be used to secure the housing 110 to the one or more terminals 134. The safety means is configured to be easily removed such that the housing 110 may be quickly detached from the one or more terminals 134.

The electrical enclosure 100 may also include one or more vents that permit heat and pressure to escape from the sealed interior 124 of the housing 110, but still prohibit open flames or sparks generated by the one or more components 120 housed within the enclosure 100 from propagating to the hazardous environment. For example, in one embodiment, one or more pieces of porous sintered metal, such as bronze, stainless steel, or aluminum, are positioned in the top portion 114 and/or the bottom portion 116 of the housing 110. The one or more pieces of sintered metal are generally configured to cover one or more openings in the housing 110. The one or more pieces of sintered metal permit heat and pressure to escape from the sealed interior 124 of the housing 110 to the atmosphere, but prohibit open flames or sparks generated by the one or more components 120 housed within the enclosure 100 from propagating to the hazardous environment. In this regard, the porous sintered metal acts as a heat sink which quenches the flame or spark. The one or more pieces of sintered material may be shaped in a variety of ways, such as circular, oval, rectangular, or square. Other configurations of vents are envisioned. For example, dome or cone shaped vents.

As illustrated in FIG. 1, the one or more terminals 134 are configured such that they may be mounted to an electrical panel 160, such as an electrical panel of an electrical box or enclosure (e.g., a NEMA enclosure). The electrical panel 160 is often mounted vertically, e.g., on a wall or other upright support structure. The removable connection formed by the first electrical connector 150 and the second electrical connector 136 is configured to permit the housing 110 to be mounted to the one or more terminals 134 in a vertical orientation without the first electrical connector 150 disconnecting from the second electrical connector 136. For example, in one embodiment, the removable connection permits a housing 110 weighing between about 3 and 15 pounds (e.g., the combined weight of the housing and one or more electrical components 120, first electrical connectors 150, and actuators 112) to be mounted to the one or more terminals 134 in a vertical orientation without the first electrical connector 150 disconnecting from the second electrical connector 136.

Further, the first and second electrical connectors 150 and 136 may be configured to provide clearance $C_1$ between the electrical panel 160 and the bottom surface of the housing 110 when the housing is mounted to the one or more terminals 134. For example, in one embodiment, a vent is positioned in the bottom 128 of the housing 110 and covers an opening in the bottom of the housing. The first and second electrical connectors 150 and 136 are configured to provide clearance between the vent and the panel 160 such that the heat and pressure can escape the sealed interior 124 through the bottom 128 of the housing 110. In one embodiment, the first and second electrical connectors 150 and 136 are configured to provide at least about 1 inch of clearance $C_1$ between the electrical panel 160 and the bottom surface of the housing 110 when the housing is mounted to the one or more terminals 134.

Figure 2:
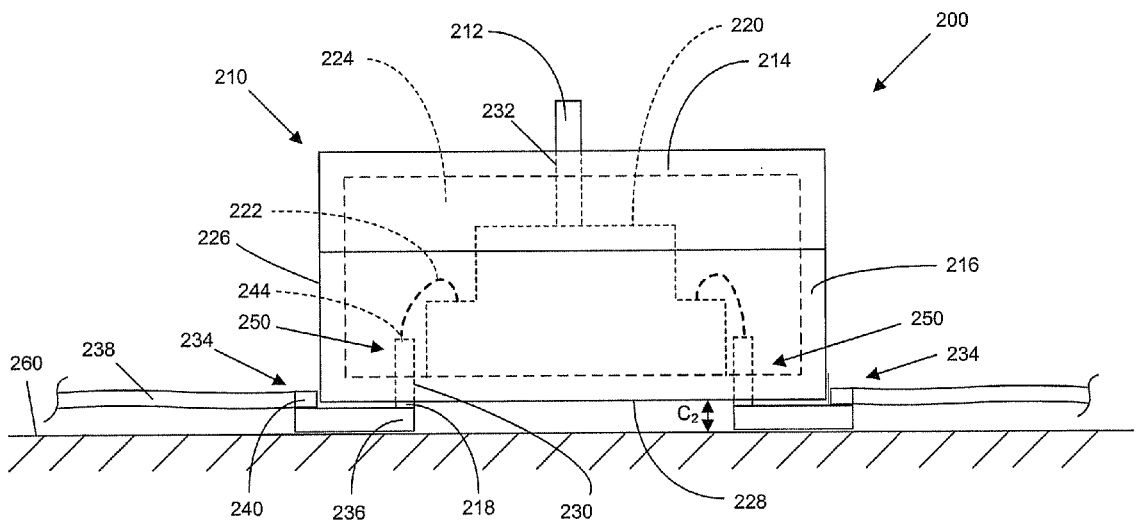
FIG. 2 is a side elevational view of one embodiment of an electrical enclosure of the present application.

FIG. 2 illustrates a sealed electrical enclosure 200 according to an embodiment of the present application. As illustrated, the electrical enclosure 200 comprises a housing 210 and one or more electrical components 220, actuators 212, electrical connectors 250, and terminals 234. One or more electrical connectors 250 of the electrical enclosure 200 extend through the bottom 228 of the housing 210. An exposed end 218 of the one or more electrical connectors 250 is electrically coupled to one or more terminals 234 of the enclosure 200. The electrical enclosure 200 is configured such that the electrical connection between the exposed end 218 of the one or more electrical connectors 250 and the one or more terminals 234 is located below the housing 210 and beneath at least a portion of the bottom surface of the housing. As such, the electrical connection is protected from potential hazards that may affect the proper functioning of the connection, e.g., various objects that may damage the connection or cause a short circuit. In this position, the electrical connection is also not exposed to inadvertent touching by individuals inspecting or maintaining the electrical enclosure 200.

As illustrated in FIG. 2, the housing 210 of the electrical enclosure 200 includes a top portion 214 removably coupled to a bottom portion 216 to form a sealed interior cavity 224 of the housing. The housing 210 may include a seal or joint between the top portion 214 and the bottom portion 216 to prohibit open flames or sparks generated by the one or more components 220 housed within the enclosure 200 from propagating to the hazardous environment. As shown, the bottom portion 216 of the housing 210 includes two sets of opposing sidewalls 226 extending upward from a bottom 228. Mounted within the housing 210 of the electrical enclosure 200 is one or more electrical components 220. The one or more electrical components 220 may include a variety of components or combination of components, such as a switch, circuit breaker, relay, controller, resistor, capacitor, transistor, power source, or other electrical component.

One or more electrical connectors 250 of the electrical enclosure 200 extend from the sealed interior 224 of the housing 210 through the bottom 228 of the housing 210. The electrical connector 250 acts as a conductor to transmit electricity between the terminal 234 and the electrical component 220 mounted within the housing 210. The electrical connector 250 may be made from one or more pieces of conductive material. The electrical connector 250 may also be rigid, non-rigid, metallic, non-metallic, shielded, or unshielded. For example, in one embodiment, the electrical connector 250 is configured as a rigid piece of metallic conductive material (e.g., copper, silver, or aluminum) that is integrally molded with the bottom portion 216 of the housing 210 (e.g., the bottom portion of the housing is molded around the electrical connector). A seal 230 is formed between the electrical connector 250 and the bottom portion 216 of the housing 210 by molding the bottom portion around the connector.

A first end 244 of the electrical connector 250 is accessible within the sealed interior 224 of the housing 210 and is configured to be electrically coupled to one or more electrical component 220 mounted within the housing. The first end 244 of the electrical connector 250 may include a fastening means to facilitate coupling the electrical connector 250 to the electrical component 220, such as a screw, clip, pin, or the like. The electrical connector 250 may also be electrically coupled, either directly or indirectly, to the electrical component 220 by various means, such as with a wire or a flexible or non-flexible piece of conductive material.

The second or exposed end 218 of the electrical connector 250 is flush with or extends slightly below a bottom surface of the housing 210. The second end 218 of the electrical connector 250 is configured to form an electrical connection with the terminal 234. For example, in one embodiment, an exposed bottom surface of the second end 218 of the electrical connector 250 contacts an outer surface of the terminal 234 to form an electrical connection between the connector and terminal. The second end 218 of the electrical connector 250 may extend below a bottom surface of the housing 210 a few hundredths or thousandths of an inch to ensure a good electrical connection with the terminal 234.

The one or more terminals 234 of the electrical enclosure 200 are configured to transmit electricity between one or more wires 238 and the one or more electrical connectors 250. A first end 240 of the terminal 234 is configured for attachment of the wire 238. The first end 240 of the terminal 234 may be configured in a variety of ways to electrically couple the wire 238 to the terminal. For example, in one embodiment, the first end 240 of the terminal 234 includes a wire connecting means, such as a plate or housing made of conductive material and configured to receive an end of the wire 238 or a connector attached to the end of the wire. A fastening means, such as a screw, bolt, clip, or the like, may be used to hold the wire 238 or connector in contact with the wire connecting means.

A second end 236 of the terminal 234 is configured to form an electrical connection with the electrical connector 250. For example, in one embodiment, the terminal 234 is configured such that an outer surface of the second end 236 contacts the exposed end 218 of the electrical connector 250 below at least a portion of the bottom of the housing 210. As such, the electrical connection between the terminal 234 and the electrical connector 250 is located below the housing 210 and beneath at least a portion of the bottom surface of the housing.

As illustrated in FIG. 2, the terminal 234 is separate from and removably coupled to the electrical connector 250 extending through the housing 210. The terminal 234 and the electrical connector 250 may be coupled together by various means, such as with a screw, bolt, clip, or other removable fastener. Often, when a wire is attached to a terminal, the terminal is subjected to ratcheting and/or bending in an effort to secure the wire to the terminal. As such, the terminal is exposed to potential damage and may need to be repaired or replaced. If the terminal is a single component extending through the housing (e.g., extending through the sidewall of the housing) of the electrical enclosure, the entire housing may need to be repaired or replaced due to the damaged terminal. The electrical enclosure 200 permits replacement or repair of a damaged terminal by uncoupling the terminal from the electrical connector 250, without having to repair or replace the housing 210. Further, the electrical enclosure 200 permits replacement of the terminal with other terminals or busses of various shapes and configurations. However, in some embodiments (not shown), the electrical connector 250 and the terminal 234 are integrally formed as a single piece of conductive material.

The terminal 234 is shaped and configured to extend outward from underneath the bottom 228 of the housing 210 and past a sidewall 226 of the housing 210. As such, the first end 240 of the terminal 234 is accessible for attachment of the wire 238 and the second end 236 of the terminal is located below the housing 210 and beneath at least a portion of the bottom surface of the housing. A variety of shapes and configurations for the terminal 234 are envisioned. For example, the terminal 234 may be configured such that the first end 240 is positioned adjacent to a sidewall 226 of the bottom portion 216 for attachment of the wire 238. Further, the terminal 234 may include a first portion that extends substantially parallel to the bottom 228 of the housing 210 and a second portion that extends substantially parallel to a sidewall 226 of the housing. The terminal 234 may also be configured to be received in a recess of the bottom portion 216 of the housing 210.

In one embodiment, the second end 218 of the electrical connector 250 is not flush with and does not extend entirely beneath the bottom surface of the housing 210. Instead, the second end 218 of the electrical connector 250 is positioned at least partially within a cavity formed in the bottom 228 of the housing 210. The cavity is shaped and configured such that the second end 236 of the terminal 234 is capable of forming an electrical connection with the second end 218 of the electrical connector 250 at least partially positioned within the cavity. For example, the second end 236 of the terminal 234 may include a protrusion extending upward from the outer surface that contacts the second end 218 of the electrical connector 250. The cavity further protects the electrical connection between the terminal 234 and the electrical connector 250 from damage.

In one embodiment, the terminal 234 and the electrical connector 250 are shaped and configured such that they may transmit between about 100 and 600 volts of electricity having a current between about 1 and 225 amperes from the wire 238 to the electrical component 220.

One or more actuators 212 extend from the sealed interior 224 through the housing 210. The one or more actuators 212 are configured to manipulate the one or more electrical components 220 (e.g., manipulating a switch of a circuit breaker). The actuator 212 may extend through the top portion 214 and/or the bottom portion 216 of the housing 210 in one or more locations. The actuator 212 also forms a seal 232 with the housing 210. The seal 232 between the actuator 212 and the housing 210 may be formed in a variety of ways.

The actuator 212 may be shaped and configured in a variety of ways. For example, the actuator 212 may be configured as an actuating rod extending through the housing 210 and movable relative to the housing to manipulate the electrical component 220. The actuating rod may be slidable and/or rotatable relative to the housing 210 to manipulate the electrical component 220. A first portion of the actuating rod may be operatively coupled to the electrical component 220 housed within the sealed interior 224 of the housing 210. A second portion of the actuating rod may be operatively coupled to an operating means, such as a knob, a switch, a lever, or the like, located exterior to the sealed interior 224 of the housing 210. As such, the operating means is exposed such that it may be used to manipulate the electrical component 220 without having to open the housing 210.

The electrical enclosure 200 may also include one or more vents that permit heat and pressure to escape from the sealed interior 224 of the housing 210, but still prohibit open flames or sparks generated by the one or more components 220 housed within the enclosure 200 from propagating to the hazardous environment. For example, one or more pieces of sintered metal (e.g., bronze, stainless steel, or aluminum) may be positioned in the top portion 214 and/or the bottom portion 216 of the housing 210. The one or more pieces of sintered metal are generally configured to cover one or more openings in the housing 210. The one or more pieces of sintered metal permit heat and pressure to escape from the sealed interior 224 of the housing 210 to the atmosphere, but still prohibit open flames or sparks generated by the one or more components 220 housed within the enclosure 200 from propagating to the hazardous environment.

As illustrated in FIG. 2, the one or more terminals 234 are configured such that they may be mounted to an electrical panel 260, such as an electrical panel of an electrical box or enclosure (e.g., a NEMA enclosure). The terminal 234 and the electrical connector 250 may be configured to provide clearance $C_2$ between the electrical panel 260 and the bottom surface of the housing 210. For example, in one embodiment, a vent is positioned in the bottom 228 of the housing 210 and covers an opening in the bottom of the housing. The terminal 234 and the electrical connector 250 are configured to provide clearance between the vent and the panel 260 such that the heat and pressure can escape the sealed interior 224 through the bottom 228 of the housing 210. In one embodiment, the terminal 234 and the electrical connector 250 are configured to provide at least about 1 inch of clearance $C_2$ between the electrical panel 260 and the bottom surface of the housing 210.

Figure 3:
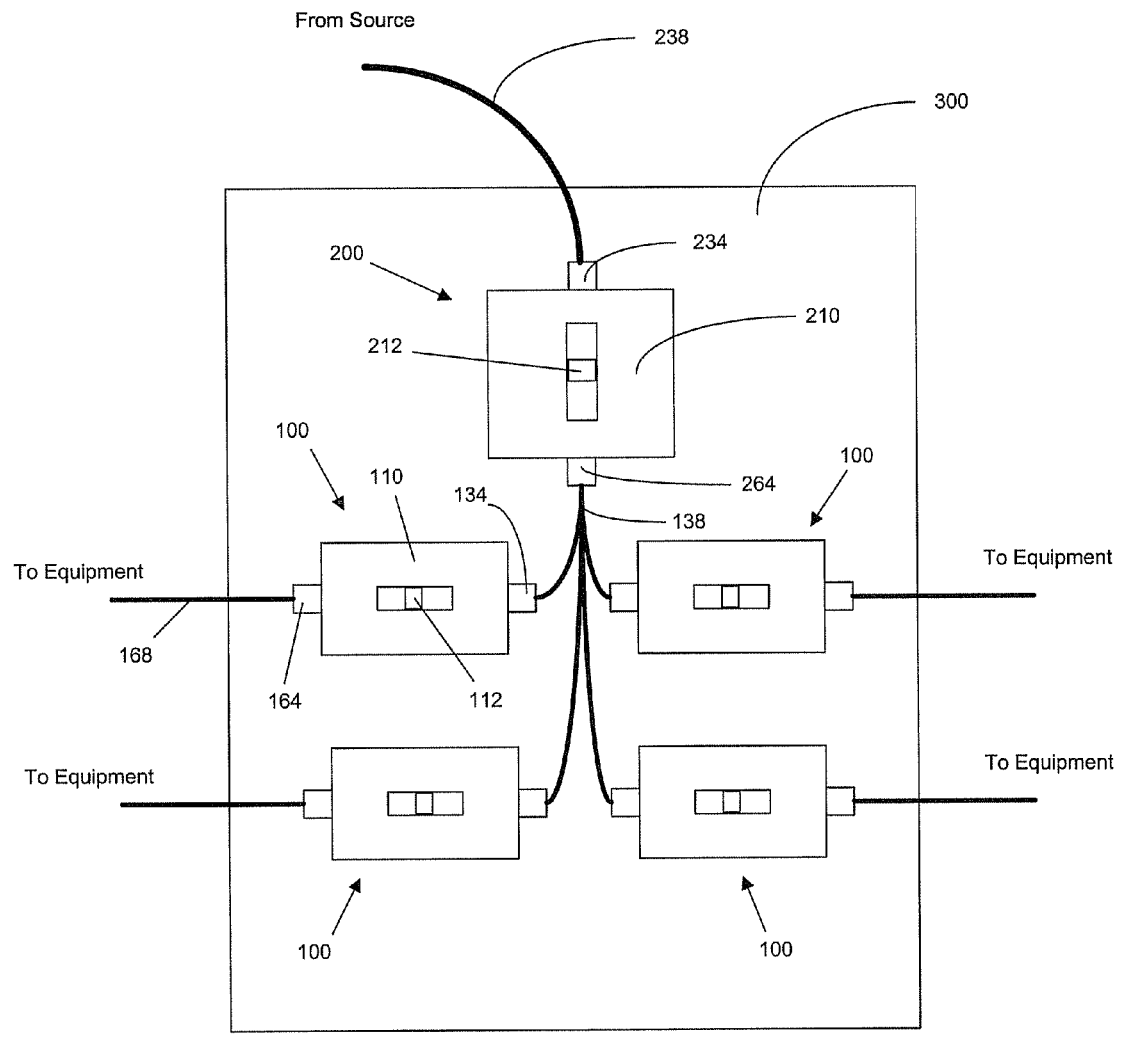
FIG. 3 is a top view of one embodiment of an electrical panel having a plurality of electrical enclosures of the present application mounted thereto.

FIG. 3 illustrates an exemplary configuration of a plurality of electrical enclosures mounted to an electrical panel 300. As illustrated, the panel 300 includes one electrical enclosure 200 as illustrated in FIG. 2 and four electrical enclosures 100 as illustrated in FIG. 1. The electrical enclosure 200 illustrated in FIG. 2 is often larger than the electrical enclosure 100 illustrated in FIG. 1 such that it may house one or more larger electrical components capable of handling higher amperage electricity, e.g., directly from a power source, although this is not always the case.

It should be understood that the configuration of electrical enclosures 100 and 200 illustrated in FIG. 3 is exemplary and many other configurations of electrical enclosures may be used. For example, any number of electrical enclosure 100 and 200 may be mounted to the panel 300. Further each electrical enclosure 100 and 200 may be shaped and configured to include any number of terminals and/or any number of electrical components housed within the electrical enclosure. Further, the electrical enclosures 100 and 200 mounted to the panel 300 may house various types of electrical components and include various types of actuators configured to manipulate the electrical component. Alternatively, one or more electrical enclosures may be mounted directly to a support structure, such as a post, wall, or beam, instead of to a panel.

As illustrated in FIG. 3, an electrical wire 238 from a power source is attached to the first terminal 234 of the electrical enclosure 200 mounted to the electrical panel 300. A plurality of wires 138 extend from the second terminal 264 of the electrical enclosure 200. Each of the wires 138 connect to the first terminal 134 of one of the electrical enclosures 100 illustrated in FIG. 1. The electrical enclosure 200 houses a main circuit breaker configured to break the electrical circuit to the electrical components mounted in the electrical enclosures 100. The actuator 212 is configured to manipulate the main circuit breaker housed within electrical enclosure 200, e.g., to break or reset the electrical circuit.

A wire 168 extends from the second terminal 164 of each electrical enclosure 100 to a piece of equipment, e.g., an electrical component, a motor, lights, machinery, etc. As illustrated in FIG. 3, each electrical enclosure 100 houses an equipment circuit breaker configured to break the electrical circuit to the piece of equipment and includes a moveable actuator 112 configured to manipulate the circuit breaker. The equipment circuit breakers are generally used more often than the main circuit breaker. As such, the equipment circuit breakers may require repair or replacement more often than the main circuit breaker. As described above, the electrical enclosure 100 is configured such that the housing may be quickly and easily removed from the terminals 134 and 164 by one person and transported to a separate location for maintenance, repair, and/or replacement of the electrical enclosure or the components thereof.

Figure 6:
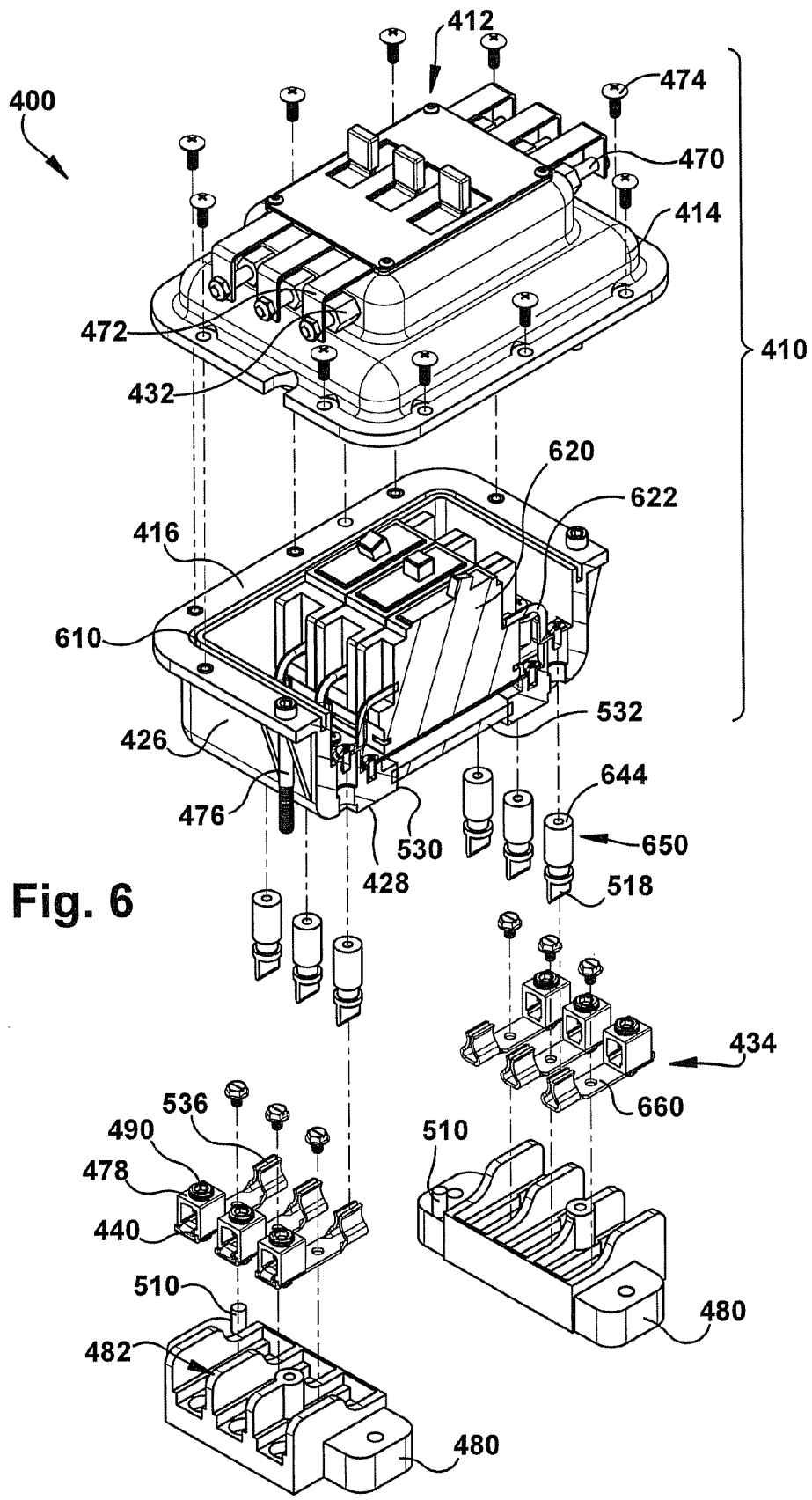
FIG. 6 is an exploded and partial cross sectional perspective view of the electrical enclosure of FIG. 4 of the present application.
Figure 7A:
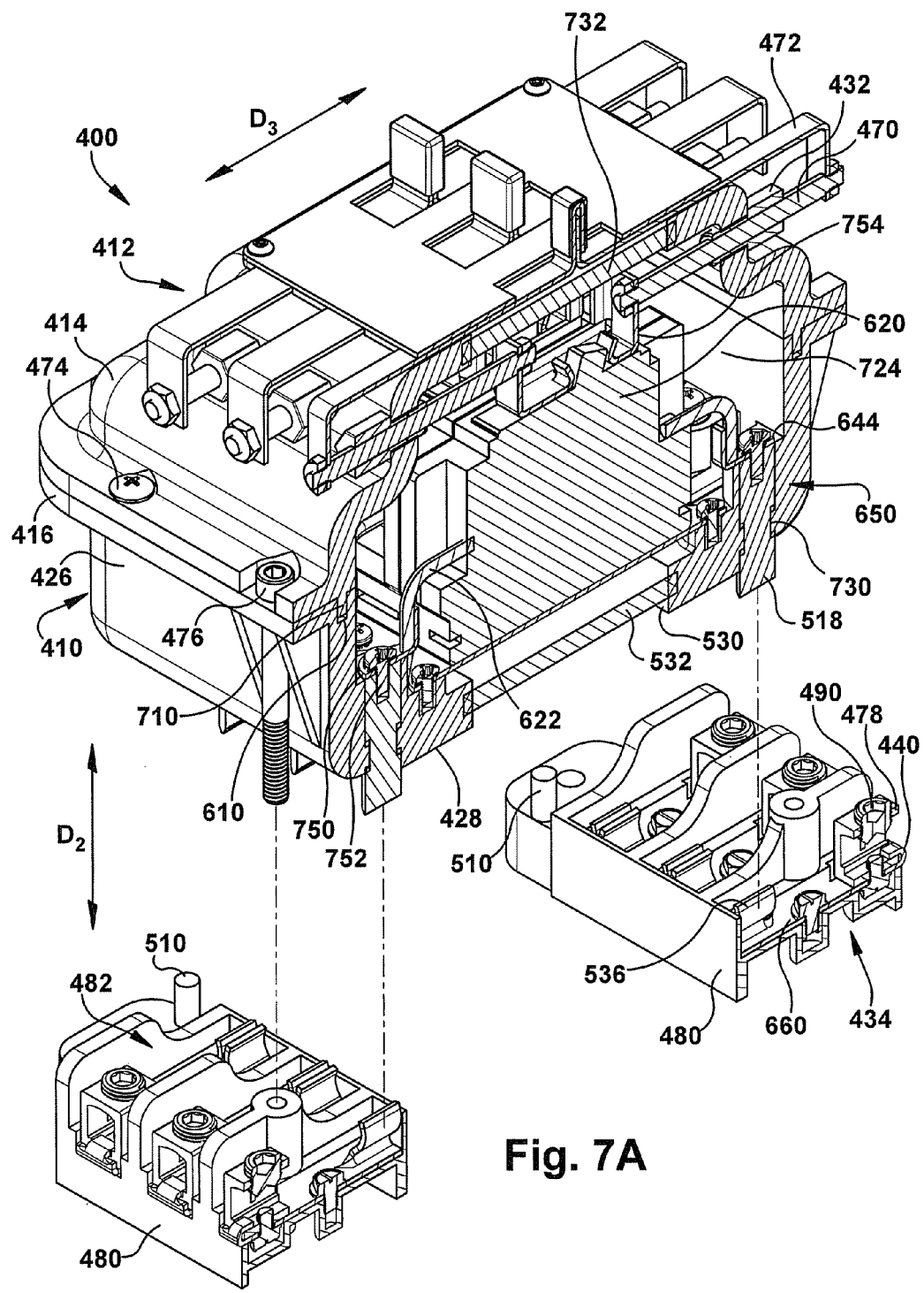
FIG. 7A is a cross sectional perspective view of the electrical enclosure of FIG. 4 illustrating one embodiment of a housing removed from a plurality of terminals of the present application.
Figure 10:
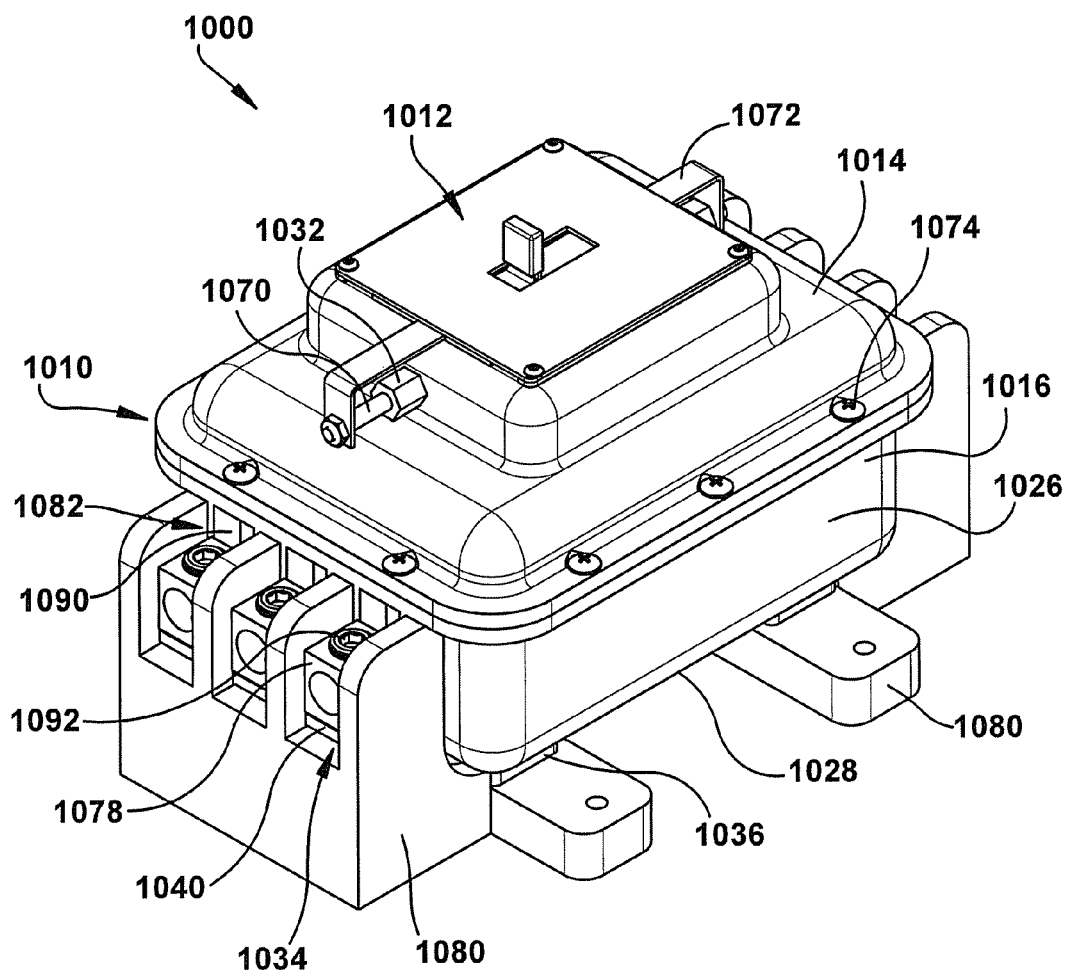
FIG. 10 is a top perspective view of one embodiment of an electrical enclosure of the present application.

FIGS. 4-7B illustrate a sealed electrical enclosure 400 according to an embodiment of the present application. As illustrated, the electrical enclosure 400 comprises a housing 410 and a plurality of circuit breakers 620, actuator assemblies 412, electrical connectors 650 and 536, and terminals 434. As illustrated in FIGS. 5, 7A, and 7B, the electrical enclosure 400 is configured such that the housing 410 may be manually removed from, or attached to, the terminals 434 without removing one or more wires from the terminals.

The housing 410 of the electrical enclosure 400 includes a top portion 414 removably coupled to a bottom portion 416 to form a sealed interior cavity 724 of the housing 410. The top portion 414 of the housing 410 is removably coupled to the bottom portion 416 by a plurality of fasteners 474. The housing 410 also includes a seal between the top portion 414 and the bottom portion 416 to prohibit open flames or sparks generated by the circuit breakers 620 housed within the enclosure 400 from propagating to the hazardous environment. As illustrated in FIGS. 7A and 7B, the top portion 414 of the housing 410 includes a circumferential ridge 710 configured to be received in a circumferential groove 610 of the bottom portion 416 to form a labyrinth seal. The bottom portion 416 of the housing 410 includes two sets of opposing sidewalls 426 extending upward from a bottom 428. The housing 410 of the electrical enclosure 400 is made of molded plastic.

As illustrated, three circuit breakers 620 are mounted within the housing 410 of the electrical enclosure 400. However, in other embodiments, more or less circuit breakers are housed within the housing 410. Each circuit breaker 620 is removably coupled to the bottom portion 416 of the housing 410 by one or more fasteners. The bottom portion 416 of the housing 410 includes molded protrusions to facilitate attachment of the circuit breaker 620 to the housing. However, in other embodiments, the circuit breakers 620 may be secured to a conductive buss of the electrical enclosure 400, e.g., directly to the first electrical connector 650.

Three pairs of first electrical connectors 650 extend from the sealed interior 724 of the housing 410 through the bottom 428 of the housing. Each first electrical connector 650 acts a conductor to transmit electricity between a terminal 434 and a circuit breaker 620 mounted within the housing 410. Each first electrical connector 650 comprises a single piece of substantially rigid conductive material configured to be integrally molded with the bottom portion 416 of the housing 410. The bottom portion 416 of the housing 410 is molded around each first electrical connector 650 to form a seal 730 between the first electrical connector and the bottom portion of the housing.

Each pair of first electrical connectors 650 are electrically coupled to a circuit breaker 620 mounted within the housing 410. More specifically, a first end 644 of each first electrical connector 650 is accessible within the sealed interior 724 of the housing 410 and is configured to be electrically coupled to the circuit breaker 620. The first end 644 of the first electrical connector 650 includes a threaded opening configured for receipt of a threaded fastener 752 to couple the first electrical connector to the circuit breaker 620. A wire 622 from the circuit breaker 620 includes a wire connector 750 having an opening. The opening of the wire connector 750 is shaped and configured to receive the threaded fastener 752 to electrically couple the first electrical connector 650 to the circuit breaker 620. However, a variety of other methods may be used to couple the first end 644 of the first electrical connector 650 to the circuit breaker 620, e.g., the first electrical connector may include a flat or formed boss used to couple the first electrical connector to the circuit breaker.

A second or exposed end 518 of each first electrical connector 650 extends below a bottom surface of the housing 410 and is configured to form a first part of a removable connection between the housing and one of the terminals 434. As illustrated in FIG. 8, the second end 518 of the first electrical connector 650 is a stab that includes a vertically orientated plate 812 having a wedge shaped end 814. The vertically orientated plate 812 includes two vertical contact surfaces configured to form an electrical connection with a second electrical connector 536. The first electrical connector 650 also includes a reduced portion 810 between the first end 644 and the second end 518. The reduced portion 810 of the first electrical connector 650 increases the axial strength of the connector and facilitates the formation of the seal 730 between the first electrical connector and the bottom portion 416 of the housing 410. The reduced portion 810 also prohibits the first electrical connector 650 from moving relative to the bottom portion 416 of the housing 410 in a direction along the longitudinal axis of the connector.

As illustrated in FIGS. 5, 7A, and 7B, the electrical enclosure 400 is configured such that the housing 410 may be removed from, or attached to, three pairs of terminals 434. Each terminal 434 is removably mounted to a terminal block 480 by one or more threaded fasteners. Each terminal block 480 includes a cavity 482 that is shaped and configured to receive the terminal 434. As illustrated in FIGS. 5 and 6, each cavity 482 of the terminal block 480 includes three sidewalls that protect the terminal 434. The terminal block 480 may be made of a variety of non-conductive materials (e.g., molded plastic).

Each terminal 434 is configured to transmit electricity between a wire and a first electrical connector 650. A first end 440 of each terminal 434 is configured for attachment of the wire. As illustrated in FIG. 9, the first end 440 of the terminal 434 includes a housing 478 made of a conductive material. The housing 478 is removably attached to a conductive plate 660 of the terminal 434 by a threaded fastener. Further, the housing 478 is shaped and configured to receive an end of the wire. A set screw 490 of the housing 478 is configured such that it may be tightened to hold the wire within the housing. However, other configurations of the first end 440 of the terminal 434 are possible. For example, the conductive plate 660 of the terminal 434 may be configured to receive a crimp lug or terminal.

The first end 440 of the terminal 434 is electrically coupled to the second electrical connector 536. The second electrical connector 536 is configured to mate with the first electrical connector 650 to form an electrical connection between the wire and the circuit breaker 620. As illustrated in FIG. 9, the second electrical connector 536 is formed from the conductive plate 660. In this regard, the second electrical connector 536 is formed by bending a first portion 910 and a second portion 912 of the plate 660 upwards to form a clip at a second end of the terminal 434 opposite the first end 440 of the terminal. The first and second portions 910 and 912 are formed such that each portion includes a concave outer surface and a convex inner surface. The convex inner surface of the first portion 910 contacts the convex inner surface of the second portion 912 in a neutral position (e.g., when the first electrical connector 650 is removed from the second electrical connector 536). This contact area between the first portion 910 and the second portion 912 is shown in FIG. 9 and is identified by reference numeral 914.

The second electrical connector 536 forms a second part of the removable connection between the housing 410 and one of the terminals 434. In this regard, the second electrical connector 536 is configured to mate with the second or exposed end 518 of the first electrical connector 650 that extends below the bottom surface of the housing 410. The second electrical connector 536 is configured to be frictionally connected to the first electrical connector 650 to attach the housing 410 to the terminal 434.

When the second or exposed end 518 of the first electrical connector 650 is inserted between the first and second portions 910 and 912 of the second electrical connector 536, each portion flexes outward from the neutral position (i.e., away from one another). The wedge shaped tip 814 of the first electrical connector 650 facilitates this flexing of the first and second portions 910 and 912. As such, the vertical plate 812 of the first electrical connector 650 is lodged between the first and second portions 910 and 912 of the second electrical connector 536. At least the convex inner surfaces of the first and second portions 910 and 912 form an electrical connection with the two vertical contact surfaces of the vertical plate 812. Further, the first and second portions 910 and 912 of the second electrical connector 536 are configured such that they are biased inward toward the neutral position. As such, the first and second portions 910 and 912 act as a clip to couple the first electrical connector 650 to the second electrical connector 536.

As illustrated in FIGS. 4 and 7B, the removable connection formed by the first and second electrical connectors 650 and 536 is positioned underneath the bottom surface of the housing 410 (e.g., not extending out from underneath the housing past a sidewall 426 of the housing). As such, the removable connection is protected from damage by the housing 410, the first end 440 of the terminal 434, and the terminal block 480. Further, as illustrated in FIG. 7A, the first and second electrical connectors 650 and 536 are configured such that the first electrical connector may be disconnected from the second electrical connector by pulling the housing in a direction $D_2$ away from the terminal 434. As such, the first and second electrical connectors 650 and 536 are configured such that they may be connected and disconnected without the use of tools.

As illustrated in FIGS. 5, 6, and 7A, each terminal block 480 includes a vertical pin 510 configured to facilitate attachment of the housing 410 to the one or more terminals 434 in a correct orientation. Each vertical pin 510 is shaped and configured to mate with an opening 512 extending partially through the bottom 428 of the housing 410. When the housing 410 is in a correct orientation relative to the terminals 434, each pin 510 is aligned with one of the openings 512 and may be received in the opening such that the housing may be attached to the terminals.

The first and second electrical connectors 650 and 536 are configured such that electrical connection formed between them is capable of transmitting between about 100 and 600 volts of electricity having a current between about 10 and 100 amperes from the wire to the circuit breaker 620. The first and second electrical connectors 650 and 536 are also shaped and configured such that the temperature of the electrical connection does not increase by more than about 30 degrees Celsius when electricity having a current between about 10 and 100 amperes is transmitted from the wire to the circuit breaker 620.

Three actuator assemblies 412 extend from the sealed interior 724 through the housing 410. Each actuator assembly 412 is configured to manipulate a switch of one of the circuit breakers 620. As illustrated in FIGS. 7A and 7B, each actuator assembly 412 includes a operating member 472 and two actuating rods 470. Each actuating rod 470 extends horizontally through the top portion 414 of the housing 410 and is movable in a direction $D_3$ relative thereto to manipulate the switch of the circuit breaker 620. A first end of each actuating rod 470 is coupled to the operating member 472 at a location exterior to the sealed interior 724 of the housing 410. A second end of each actuating rod 470 is coupled to a bracket 754 within the sealed interior 724 of the housing 410. Each bracket 754 is shaped and configured to contact the switch of the circuit breaker 620. As such, movement of the actuating rod 470 relative to the housing 410 in the direction $D_3$ moves the bracket 754 coupled thereto to manipulate the switch of the circuit breaker 620.

The operating member 472 of the actuator assembly 412 is exposed such that it may be used to manipulate the switch of the circuit breaker 620 without having to remove the top portion 414 of the housing 410. Sliding the operating member 472 horizontally back and forth in a direction $D_3$ moves each actuating rod 470 in and out of the housing 410. As such, the movement of the operating member 472 back and forth in a direction $D_3$ manipulates the switch of the circuit breaker 620 back and forth.

An insert 432 is positioned between each actuating rod 470 of each actuator assembly 412 and the housing 410. The insert 432 is configured to provide a seal between the actuating rod 470 and the housing 410. Each insert 432 includes an external sealing surface and an internal sealing surface. The external sealing surface of the insert 432 is shaped and configured to form a seal with an internal surface of an opening in the housing 410. The internal sealing surface of the insert 432 is shaped and configured to form a seal with an external surface of the actuating rod 470 as the rod is moved relative to the housing 410. The insert 432 is also shaped and configured such that it is held stationary relative to the housing 410 as the actuating rod 470 is moved relative to the housing.

The electrical enclosure 400 also includes removable safety bolts 476 for securing the housing 410 to the terminal blocks 480. As illustrated in FIG. 5, each safety bolt 476 is configured to couple the bottom portion 416 of the housing 410 to a terminal block 480. The safety bolts 476 are accessible and are configured to be easily removed such that the housing 410 may be quickly detached from the terminals 434.

The electrical enclosure 400 also includes vents 532 and 732 positioned in the top portion 414 and the bottom portion 416 of the housing 410. The vents 532 and 732 permit heat and pressure to escape from the sealed interior 724 of the housing 410, but still prohibit open flames or sparks generated by the circuit breakers 620 housed within the enclosure 400 from propagating to the hazardous environment. The vents 532 and 732 are made from sintered metal, such as bronze, stainless steel, or aluminum. Each vent 532 and 732 is configured to cover one or more openings in the housing 410. For example, as illustrated in FIG. 5, a vent 532 covers two openings 530 in the bottom 428 of the housing 410. An opening in the housing 410 may include a circumferential groove for holding the vent 532 and 732 within the opening.

Figure 11:
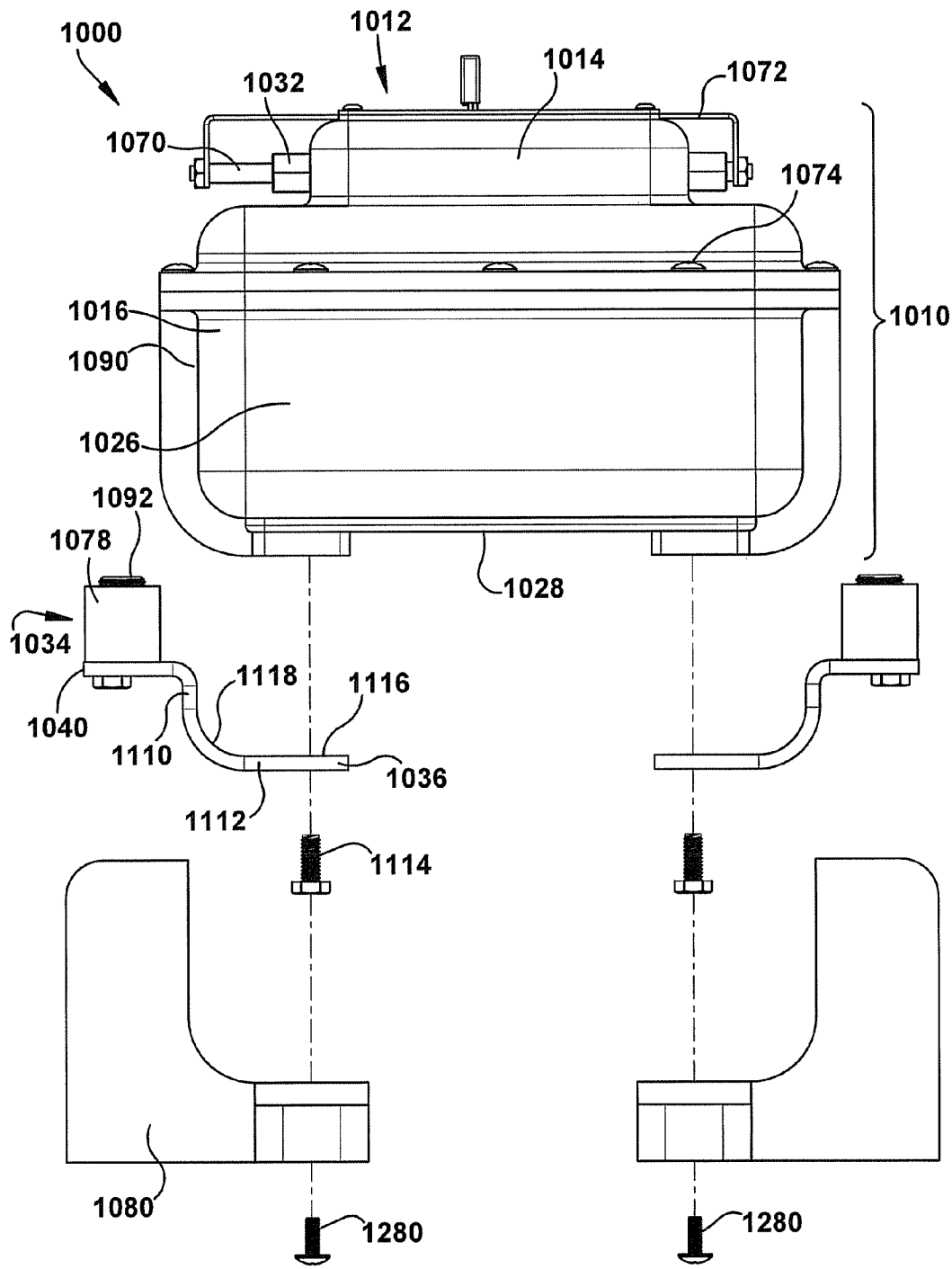
FIG. 11 is an exploded side view of the electrical enclosure of FIG. 10 of the present application.
Figure 12:
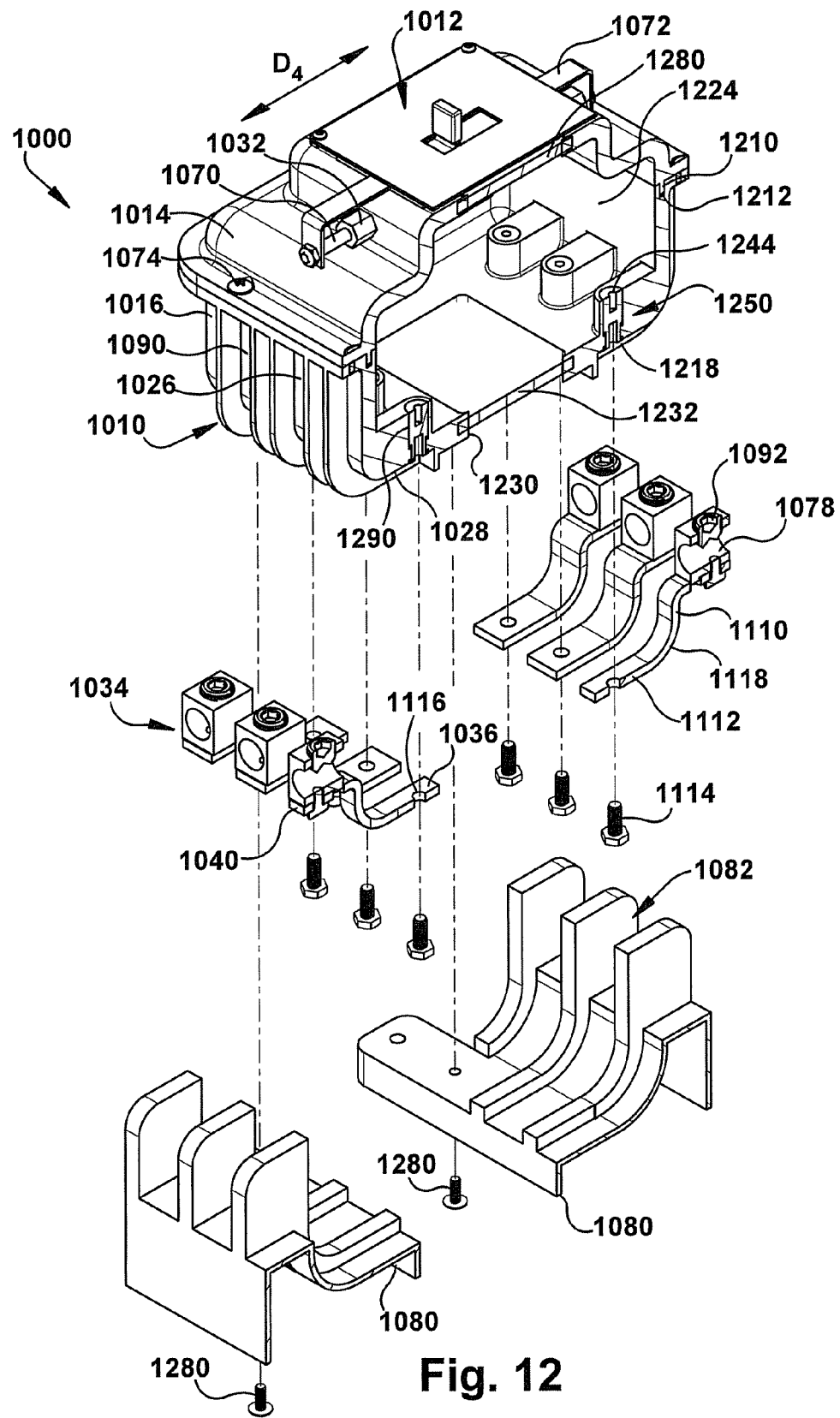
FIG. 12 is an exploded and partial cross sectional perspective view of the electrical enclosure of FIG. 10 of the present application.
Figure 13:
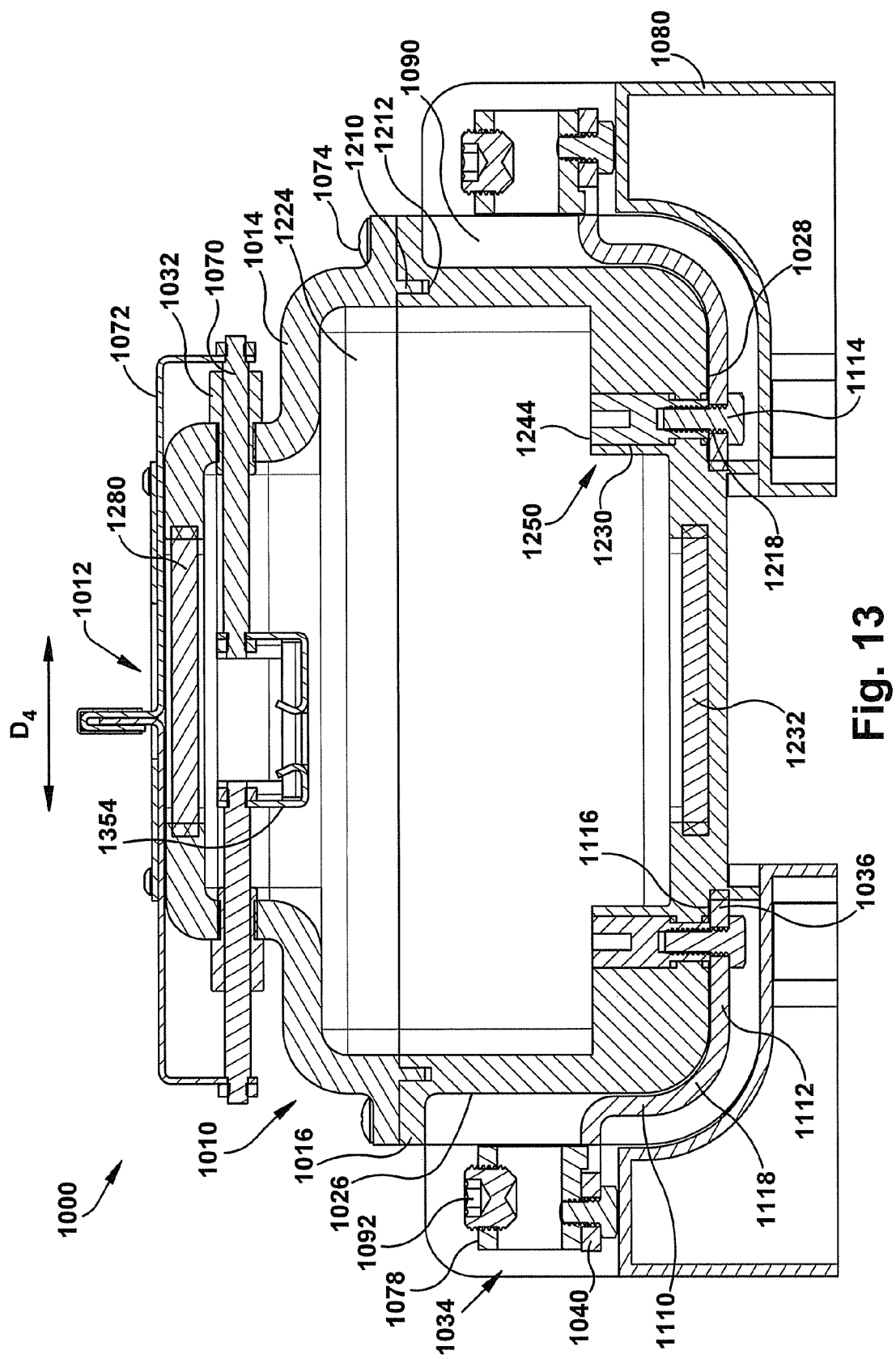
FIG. 13 is a side cross sectional view of the electrical enclosure of FIG. 10 of the present application.

FIGS. 10-13 illustrate a sealed electrical enclosure 1000 according to an embodiment of the present application. As illustrated, the electrical enclosure 1000 comprises a housing 1010 for one or more electrical components, an actuator assembly 1012, and a plurality of electrical connectors 1250 and terminals 1034. As illustrated in FIGS. 12 and 13, three pairs of electrical connectors 1250 extend through the bottom 1028 of the housing 1010. An exposed end 1218 of each electrical connector 1250 is electrically coupled to a terminal 1034 of the enclosure 1000. The electrical enclosure 1000 is configured such that the electrical connection between the exposed end 1218 of the electrical connector 1250 and the terminal 1034 is located below the housing 1010 and beneath at least a portion of the bottom surface of the housing. As such, the electrical connection is protected from potential hazards that may affect the proper functioning of the connection. Further, the electrical connection is not exposed to inadvertent touching by individuals inspecting or maintaining the electrical enclosure 1000. The electrical enclosure 1000 also includes two terminal blocks 1080 having at least one cavity 1082 shaped and configured to receive the terminal 1034. The cavity 1082 of the terminal block 1080 includes a plurality of sidewalls that further protect the terminal 1034 and the electrical connection from potential hazards or inadvertent touching.

The housing 1010 of the electrical enclosure 1000 includes a top portion 1014 removably coupled to a bottom portion 1016 to form a sealed interior cavity 1224 of the housing. The top portion 1014 of the housing 1010 is removably coupled to the bottom portion 1016 by a plurality of threaded fasteners 1074. The housing 1010 also includes a seal between the top portion 1014 and the bottom portion 1016 to prohibit open flames or sparks generated by the one or more components housed within the enclosure 1000 from propagating to the hazardous environment. As illustrated in FIGS. 12 and 13, the top portion 1014 of the housing 1010 includes a circumferential ridge 1210 configured to be received in a circumferential groove 1212 of the bottom portion 1016 to form a labyrinth seal. The bottom portion 1016 of the housing 1010 includes two sets of opposing sidewalls 1026 extending upward from a bottom 1028. As illustrated, the housing 1010 is made of molded plastic. Although not shown in FIGS. 12 and 13, the housing 1010 is configured for housing one or more electrical components. The one or more electrical components may be mounted to the bottom portion 1016 of the housing 1010.

Three pairs of electrical connectors 1250 extend from the sealed interior 1224 of the housing 1010 through the bottom 1028 of the housing. Each electrical connector 1250 acts a conductor to transmit electricity between a terminal 1034 and an electrical component mounted within the housing 1010. Each electrical connector 1250 comprises a single piece of substantially rigid conductive material configured to be integrally molded with the bottom portion 1016 of the housing 1010. The bottom portion 1016 of the housing 1010 is molded around each electrical connector 1250 to form a seal 1290 between the electrical connector and the bottom portion of the housing.

Each pair of electrical connectors 1250 are configured to be electrically coupled to an electrical component mounted within the housing 1010. More specifically, a first end 1244 of each electrical connector 1250 is accessible within the sealed interior 1224 of the housing 1010 and is configured to be electrically coupled to the electrical component. The first end 1244 of the electrical connector 1250 includes a threaded opening configured for receipt of a threaded fastener to couple the electrical connector to the electrical component.

A second or exposed end 1218 of the electrical connector 1250 is flush with a portion of the bottom surface of the housing 1010. The second end 1218 of the electrical connector 1250 is configured to form an electrical connection with the terminal 1034. As illustrated in FIG. 13, an exposed bottom surface of the second end 1218 of the electrical connector 1250 contacts an outer surface 1116 of the terminal 1034 to form an electrical connection between the connector and terminal.

As illustrated in the Figures, the electrical enclosure 1000 is configured such that the housing 1010 may be removed from, or attached to, three pairs of terminals 1034. Further, the housing 1010 is removably mounted to two terminal blocks 1080 by a plurality of threaded fasteners 1280. Each terminal block 1080 includes three cavities 1082 that are shaped and configured to receive the terminals 1034. Each cavity 1082 of the terminal block 1080 includes a plurality of sidewalls that protect the terminal 1034 and the electrical connection between the terminal and the electrical connector 1250. The terminal block 1080 may be made of a variety of non-conductive materials (e.g., molded plastic).

Each terminal 1034 is configured to transmit electricity between a wire and an electrical connector 1250. A first end 1040 of each terminal 1034 is configured for attachment of the wire. As illustrated in the Figures, the first end 1040 of the terminal 1034 includes a housing 1078 made of a conductive material. The housing 1078 is removably attached to a conductive plate 1118 of the terminal 1034 by a threaded fastener. Further, the housing 1078 is shaped and configured to receive an end of the wire. A set screw 1092 of the housing 1078 is configured such that it may be tightened to hold the wire within the housing.

A second end 1036 of the terminal 1034 is configured to form an electrical connection with the electrical connector 1250. The terminal 1034 is configured such that an outer top surface 1116 of the conductive plate 1118 contacts the exposed bottom surface of the electrical connector 1250 at a location below at least a portion of the bottom of the housing 1010. As such, the electrical connection between the terminal 1034 and the electrical connector 1250 is located below the housing 1010 and beneath at least a portion of the bottom surface of the housing. Further, as illustrated in the Figures, the terminal 1034 is separate from and removably coupled to the electrical connector 1250 extending through the housing 1010. The terminal 1034 and the electrical connector 1250 are coupled together by a fastener 1114. As such, the electrical enclosure 1000 permits replacement or repair of a damaged terminal by uncoupling the terminal from the electrical connector.

As illustrated in FIGS. 11 and 13, the terminal 1034 is shaped and configured to extend outward from underneath the bottom 1028 of the housing 1010 and past a sidewall 1026 of the housing. As such, the first end 1040 of the terminal 1034 is accessible for attachment of the wire and the second end 1036 of the terminal is located below the housing 1010 and beneath at least a portion of the bottom surface of the housing. Further, the terminal 1034 includes a first portion 1112 that extends horizontally and substantially parallel to the bottom 1028 of the housing 1010 and a second portion 1110 that extends vertically and substantially parallel to a sidewall 1026 of the housing. As such, the first end 1040 of the terminal 1034 is positioned adjacent to a sidewall 1026 of the bottom portion 1016 for attachment of the wire.

As illustrated in the Figures, the terminals 1034 are also shaped and configured to be received in recessed portions 1090 of the bottom portion 1016 of the housing 1010. The recessed portions 1090 in the bottom portion 1016 further protect the terminal 1034 from damage and inadvertent touching. As illustrated, the second end 1036 of the terminal 1034 is received within a cavity formed by the recessed portion 1090 such that a bottom surface of the ribs forming the cavity are below a bottom surface of the second end of the terminal. In one embodiment, the distance between the bottom surface of the ribs and the bottom surface of the second end 1036 of the terminal 1034 is about 0.3 inches.

The terminal 1034 and the electrical connector 1250 are configured such that electrical connection formed between them is capable of transmitting between about 100 and 600 volts of electricity having a current between about 1 and 225 amperes from the wire to an electrical component.

The actuator assembly 1012 extends from the sealed interior 1224 through the housing 1010. The actuator assembly 1012 is configured to manipulate an electrical component housed within the housing 1010. As illustrated in FIG. 13, the actuator assembly 1012 includes an operating member 1072 and two actuating rods 1070. Each actuating rod 1070 extends horizontally through the top portion 1016 of the housing 1010 and is movable in a direction $D_4$ relative thereto to manipulate the electrical component. A first end of the actuating rod 1070 is coupled to the operating member 1072 at a location exterior to the sealed interior 1224 of the housing 1010. A second end of each actuating rod 1070 is coupled to a bracket 1354 within the sealed interior 1224 of the housing 1010. Each bracket 1354 is shaped and configured to contact a switch of the electrical component. As such, movement of the actuating rod 1070 relative to the housing 1010 in the direction $D_4$ moves the bracket 1354 coupled thereto to manipulate the switch of the electrical component.

The operating member 1072 of the actuator assembly 1012 is exposed such that it may be used to manipulate the switch of the electrical component without having to remove the top portion 1014 of the housing 1010. Sliding the operating member 1072 horizontally back and forth in a direction $D_4$ moves each actuating rod 1070 in and out of the housing 1010. As such, the movement of the operating member 1072 back and forth in a direction $D_4$ manipulates the switch of the electrical component back and forth.

An insert 1032 is positioned between each actuating rod 1070 of the actuator assembly 1012 and the housing 1010. The insert 1032 is configured to provide a seal between the actuating rod 1070 and the housing 1010. Each insert 1032 includes an external sealing surface and an internal sealing surface. The external sealing surface of the insert 1032 is shaped and configured to form a seal with an internal surface of an opening in the housing 1010. The internal sealing surface of the insert 1032 is shaped and configured to form a seal with an external surface of the actuating rod 1070 as the rod is moved relative to the housing 1010. The insert 1032 is also shaped and configured such that it is held stationary relative to the housing 1010 as the actuating rod 1070 is moved relative to the housing.

The electrical enclosure 1000 also includes vents 1232 and 1280 positioned in the top portion 1014 and the bottom portion 1016 of the housing 1010. The vents 1232 and 1280 permit heat and pressure to escape from the sealed interior 1224 of the housing 1010, but still prohibit open flames or sparks generated by the one or more components housed within the enclosure 1000 from propagating to the hazardous environment. The vents 1232 and 1280 are made from sintered metal, such as bronze, stainless steel, or aluminum. Each vent 1232 and 1280 is configured to cover one or more openings in the housing 1010. For example, as illustrated in FIG. 12, a vent 1232 covers an opening 1230 in the bottom 1028 of the housing 1010. An opening in the housing 1010 may include a circumferential groove for holding the vent 1232 and 1280 within the opening.

Figure 14:
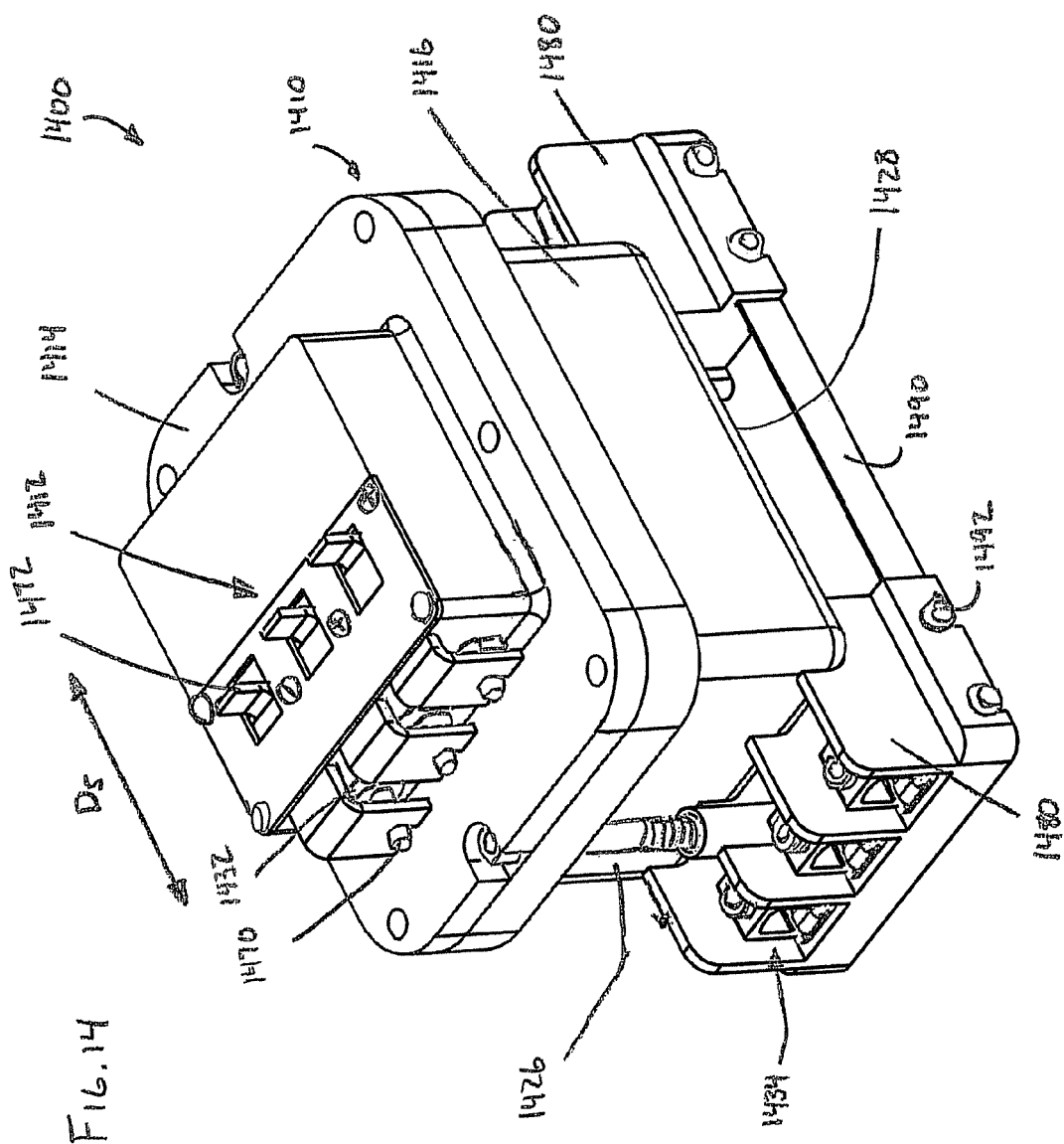
FIG. 14 is a top perspective view of one embodiment of an electrical enclosure of the present application.

FIGS. 14-16 illustrate a sealed electrical enclosure 1400 according to an embodiment of the present application. As illustrated, the electrical enclosure 1400 comprises a housing 1410 and a plurality of circuit breakers 1620, actuator assemblies 1412, electrical connectors 1650 and 1636, and terminals 1434. As illustrated in FIGS. 15 and 16, the electrical enclosure 1400 is configured such that the housing 1410 may be manually removed from, or attached to, the terminals 1434 without removing one or more wires from the terminals.

The housing 1410 of the electrical enclosure 1400 includes a top portion 1414 removably coupled to a bottom portion 1416 to form a sealed interior cavity 1624 of the housing 1410. The housing 1410 also includes a labyrinth seal 1620 between the top portion 1414 and the bottom portion 1416 to prohibit open flames or sparks generated by the circuit breakers 1620 housed within the enclosure 1400 from propagating to the hazardous environment. The bottom portion 1416 of the housing 1410 includes two sets of opposing sidewalls 1426 extending upward from a bottom 1428. The housing 1410 of the electrical enclosure 1400 is made of molded plastic.

Three pairs of first electrical connectors 1650 extend from the sealed interior 1624 of the housing 1410 through the bottom 1428 of the housing. Each first electrical connector 1650 acts a conductor to transmit electricity between a terminal 1434 and a circuit breaker 1620 mounted within the housing 1410. Each first electrical connector 1650 comprises a single piece of substantially rigid conductive material configured to be integrally molded with the bottom portion 1416 of the housing 1410. The bottom portion 1416 of the housing 1410 is molded around each first electrical connector 1650 to form a seal between the first electrical connector and the bottom portion of the housing.

Each pair of first electrical connectors 1650 are electrically coupled to a circuit breaker 1620 mounted within the housing 1410. More specifically, a first end 1644 of each first electrical connector 1650 is accessible within the sealed interior 1624 of the housing 1410 and is configured to be electrically coupled to the circuit breaker 1620. As illustrated, the first end 1644 of the first electrical connector 1650 is shaped as a cylindrical boss extending into the sealed interior 1624 of the housing 1410. The first end 1644 of the first electrical connector 1650 includes a threaded opening configured for receipt of a threaded fastener 1652 to couple the first electrical connector to the circuit breaker 1620. A conductive plate 1622 of the circuit breaker 1620 includes an opening shaped and configured to receive the threaded fastener 1652 to electrically couple the first electrical connector 1650 to the circuit breaker 1620.

Similar to sealed electrical enclosure 400 shown in FIGS. 4-7B, a second or exposed end 1518 of each first electrical connector 1650 extends below a bottom surface of the housing 1410 and is configured to form a first part of a removable connection between the housing and one of the terminals 1434. A second electrical connector 1636 forms a second part of the removable connection between the housing 1410 and one of the terminals 1434. In this regard, the second electrical connector 1636 is configured to mate with the second or exposed end 1518 of the first electrical connector 1650 that extends below the bottom surface of the housing 1410. The second electrical connector 1636 is configured to be frictionally connected to the first electrical connector 1650 to attach the housing 1410 to the terminal 1434.

As illustrated in FIGS. 15 and 16, each terminal block 1480 includes a vertical pin 1510 configured to facilitate attachment of the housing 1410 to the one or more terminals 1434 in a correct orientation. Each vertical pin 1510 is shaped and configured to mate with an opening 1512 extending partially through the bottom 1428 of the housing 1410. When the housing 1410 is in a correct orientation relative to the terminals 1434, each pin 1510 is aligned with one of the openings 1512 and may be received in the opening such that the housing may be attached to the terminals.

Three actuator assemblies 1412 extend from the sealed interior 1624 through the housing 1410. Each actuator assembly 1412 is configured to manipulate a switch of one of the circuit breakers 1620. As illustrated, each actuator assembly 1412 includes an operating member 1472 and an actuating rod 1470. The actuating rod 1470 extends horizontally through the top portion 1414 of the housing 1410 and is movable in a direction $D_5$ relative thereto to manipulate the switch of the circuit breaker 1620. A first end of the actuating rod 1470 is coupled to the operating member 1472 at a location exterior to the sealed interior 1624 of the housing 1410. A second end of the actuating rod 1470 is coupled to a bracket within the sealed interior 1624 of the housing 1410. The bracket is shaped and configured to contact the switch of the circuit breaker 1620. As such, movement of the actuating rod 1470 relative to the housing 1410 in the direction $D_5$ moves the bracket coupled thereto to manipulate the switch of the circuit breaker 1620.

The operating member 1472 of the actuator assembly 1412 is exposed such that it may be used to manipulate the switch of the circuit breaker 1620 without having to remove the top portion 1414 of the housing 1410. Sliding the operating member 1472 horizontally back and forth in a direction $D_5$ moves the actuating rod 1470 in and out of the housing 1410. As such, the movement of the operating member 1472 back and forth in a direction $D_5$ manipulates the switch of the circuit breaker 1620 back and forth.

An insert 1432 is positioned between the actuating rod 1470 of each actuator assembly 1412 and the housing 1410. The insert 1432 is configured to provide a seal between the actuating rod 1470 and the housing 1410.

As illustrated in FIG. 15, the electrical enclosure 1400 also includes a vent 1532 positioned in the bottom portion 1416 of the housing 1410. The vent 1532 permits heat and pressure to escape from the sealed interior 1624 of the housing 1410, but still prohibits open flames or sparks generated by the circuit breakers 1620 housed within the enclosure 1400 from propagating to the hazardous environment. The vent 1532 is made from sintered metal, such as bronze, stainless steel, or aluminum. The vent 1532 is configured to cover an opening 1532 in the bottom 1428 of the housing 1410 that is perpendicular to the longitudinal axis of the enclosure 1400.

As illustrated in FIGS. 14-16, the terminal blocks 1480 are connected together by one or more bracket members 1490. The bracket members 1490 are attached to each terminal block 1480 by one or more fasteners 1492. The bracket members 1490 include openings for mounting the bracket members and terminal blocks 1480 to an electrical panel. As such, the terminal blocks 1480 may be mounted to the electrical panel as single unit by attaching the one or more bracket members 1490 to the panel.

As described herein, when one or more components are described as being connected, joined, affixed, coupled, attached, or otherwise interconnected, such interconnection may be direct as between the components or may be in direct such as through the use of one or more intermediary components. Also as described herein, reference to a "member," "component," or "portion" shall not be limited to a single structural member, component, or element but can include an assembly of components, members or elements.

While the present invention has been illustrated by the description of embodiments thereof, and while the embodiments have been described in considerable detail, it is not the intention of the applicants to restrict or in any way limit the scope of the invention to such details. Additional advantages and modifications will readily appear to those skilled in the art. For example, where components are releasably or removably connected or attached together, any type of releasable connection may be suitable including for example, locking connections, fastened connections, tongue and groove connections, etc. Still further, component geometries, shapes, and dimensions can be modified without changing the overall role or function of the components. The electrical enclosure of the present application may be configured with more or less electrical components, terminals, terminal blocks, actuators, or electrical connectors. Therefore, the inventive concept, in its broader aspects, is not limited to the specific details, the representative apparatus, and illustrative examples shown and described. Accordingly, departures may be made from such details without departing from the spirit or scope of the applicant's general inventive concept.

While various inventive aspects, concepts and features of the inventions may be described and illustrated herein as embodied in combination in the exemplary embodiments, these various aspects, concepts and features may be used in many alternative embodiments, either individually or in various combinations and sub-combinations thereof. Unless expressly excluded herein all such combinations and sub-combinations are intended to be within the scope of the present inventions. Still further, while various alternative embodiments as to the various aspects, concepts and features of the inventions—such as alternative materials, structures, configurations, methods, devices and components, alternatives as to form, fit and function, and so on—may be described herein, such descriptions are not intended to be a complete or exhaustive list of available alternative embodiments, whether presently known or later developed. Those skilled in the art may readily adopt one or more of the inventive aspects, concepts or features into additional embodiments and uses within the scope of the present inventions even if such embodiments are not expressly disclosed herein. Additionally, even though some features, concepts or aspects of the inventions may be described herein as being a preferred arrangement or method, such description is not intended to suggest that such feature is required or necessary unless expressly so stated. Still further, exemplary or representative values and ranges may be included to assist in understanding the present disclosure, however, such values and ranges are not to be construed in a limiting sense and are intended to be critical values or ranges only if so expressly stated. Moreover, while various aspects, features and concepts may be expressly identified herein as being inventive or forming part of an invention, such identification is not intended to be exclusive, but rather there may be inventive aspects, concepts and features that are fully described herein without being expressly identified as such or as part of a specific invention, the inventions instead being set forth in the appended claims. Descriptions of exemplary methods or processes are not limited to inclusion of all steps as being required in all cases, nor is the order that the steps are presented to be construed as required or necessary unless expressly so stated.

What is claimed is:

1. A sealed electrical enclosure for housing an electrical component, comprising:
    a housing have a top portion removably coupled to a bottom portion, the bottom portion having a plurality of sidewalls extending from a bottom, the housing having a sealed interior when the top portion is coupled to the bottom portion;
    a first electrical connector extending from the sealed interior through the bottom of the housing, the first electrical connector being electrically coupled to an electrical component housed within the electrical enclosure and forming a first seal with the bottom of the housing;
    an actuator extending from the sealed interior through the housing, the actuator configured to manipulate the electrical component and forming a second seal with the housing; and
    a terminal for attachment of a wire, the terminal being electrically coupled to a second electrical connector, the second electrical connector configured to mate with the first electrical connector to form an electrical connection between the wire and the electrical component;
    wherein the first and second electrical connectors are configured to be connected and disconnected to attach and remove the housing to and from the terminal without removing the wire from the terminal.

2. The sealed electrical enclosure of claim 1, wherein the first electrical connector includes a rigid piece of conductive material extending outward from the bottom of the housing.

3. The sealed electrical enclosure of claim 1, wherein the second electrical connector is integrally formed with at least a portion of the terminal.

4. The sealed electrical enclosure of claim 1, wherein the first electrical connector is frictionally connected to the second electrical connector to attach the housing to the terminal.

5. The sealed electrical enclosure of claim 4, wherein the first electrical connector includes a vertical plate extending outward from the bottom of the housing and configured to mate with a clip portion of the second electrical connector.

6. The sealed electrical enclosure of claim 5, wherein the vertical plate includes at least two vertical surfaces and the clip portion includes at least two convex surfaces, and wherein at least the convex surfaces of the clip portion form an electrical connection with the vertical surfaces of the vertical plate.

7. The sealed electrical enclosure of claim 4, wherein first and second electrical connectors are configured such that the temperature of the connectors does not increase by more than about 30 degrees Celsius when electricity having a current between about 10 and 100 amperes is transmitted from the wire to the electrical component.

8. The sealed electrical enclosure of claim 4, wherein the first electrical connector is configured to be disconnected from the second electrical connector by pulling the bottom portion of the housing in a direction away from the terminal.

9. The sealed electrical enclosure of claim 4, wherein the combined weight of the housing, the electrical component, the first electrical connector, and the actuator is between about 3 and 15 pounds, and wherein the first and second electrical connectors are configured to permit the housing to be mounted to the terminal vertically on a panel without the first electrical connector disconnecting from the second electrical connector.

10. The sealed electrical enclosure of claim 1, wherein at least the bottom portion of the housing is molded plastic, and wherein the first seal is formed by molding the bottom portion of the housing around the first electrical connector.

11. The sealed electrical enclosure of claim 1, wherein the electrical component housed in the electrical enclosure is a circuit breaker.

12. The sealed electrical enclosure of claim 1 further comprising a safety means configured to secure the housing to the terminal.

13. The sealed electrical enclosure of claim 1 further comprising a vent in the bottom of the housing, the vent configured to permit heat and pressure to escape the sealed interior of the housing.

14. The sealed electrical enclosure of claim 13, wherein the terminal is mounted to a panel, and wherein the first and second electrical connectors are configured to provide at least about 1 inch of clearance between the panel and the vent when the housing is mounted to the terminal such that the heat and pressure can escape the sealed interior of the housing.

15. The sealed electrical enclosure of claim 1 further comprising a locating means configured to facilitate attachment of the housing to the terminal in a correct orientation.

16. The sealed electrical enclosure of claim 1, wherein the first and second electrical connectors are configured to be connected and disconnected without the use of tools.

17. The sealed electrical enclosure of claim 1, comprising:
a pair of first electrical connectors extending from the sealed interior through the bottom of the housing, each first electrical connector being electrically coupled to the electrical component and forming a seal with the bottom of the housing;
a pair of terminals for attachment of a wire; and
a pair of second electrical connectors;
wherein each terminal is electrically coupled to one of the second electrical connectors and each second electrical connector is configured to mate with one of the first electrical connectors to form an electrical connection between a wire and the electrical component; and
wherein the first and second electrical connectors are configured to be connected and disconnected to attach and remove the housing to and from the pair of terminals without removing the wire from the terminal.

18. A sealed electrical enclosure for housing an electrical component, comprising:
a housing having a top portion removably coupled to a bottom portion, the bottom portion having a plurality of sidewalls extending from a bottom, the housing having a sealed interior when the top portion is coupled to the bottom portion;
an electrical connector extending from the sealed interior through the bottom of the housing, the electrical connector being electrically coupled to an electrical component housed within the electrical enclosure and forming a first seal with the bottom of the housing;
an actuator extending from the sealed interior through the housing, the actuator configured to manipulate the electrical component and forming a second seal with the housing; and
a terminal having a first end and a second end, the first end configured for attachment of a wire and the second end configured for attachment to the electrical connector, the terminal and the electrical connector forming an electrical connection between the wire and the electrical component;
wherein the terminal is configured to extend outward from underneath the bottom of the housing and past a sidewall of the housing such that the first end of the terminal is accessible for attachment of the wire, and wherein the terminal is configured such that an outer surface of the second end contacts an exposed end of the electrical connector below at least a portion of the bottom of the housing, and wherein the terminal is removably coupled to the electrical connector.

19. The sealed electrical enclosure of claim 18, wherein the terminal is configured such that the first end is positioned adjacent to a sidewall of the bottom portion for attachment of the wire.

20. The sealed electrical enclosure of claim 18, wherein the exposed end of the electrical connector is flush with a bottom surface of the bottom.

21. The sealed electrical enclosure of claim 18, wherein the terminal includes a first portion that extends substantially parallel to the bottom of the housing and a second portion that extends substantially parallel to a sidewall of the housing.

22. The sealed electrical enclosure of claim 21, wherein the terminal is configured to be received in a recess of the bottom portion of the housing.

23. The sealed electrical enclosure of claim 22 further comprising a terminal block having a cavity configured to receive the terminal, the cavity having a plurality of sidewalls that protect the terminal and the electrical connection between the terminal and the electrical connector.

24. The sealed electrical enclosure of claim 18, wherein the second end of the terminal is removably coupled to the electrical connector with a fastener.

25. The sealed electrical enclosure of claim 18, wherein at least the bottom portion of the housing is molded plastic, and wherein the first seal is formed by molding the bottom portion of the housing around the electrical connector.

26. The sealed electrical enclosure of claim 18, wherein the electrical component housed in the electrical enclosure is a circuit breaker.

27. The sealed electrical enclosure of claim 18 further comprising a vent in the bottom of the housing, the vent configured to permit heat and pressure to escape the sealed interior of the housing.

28. The sealed electrical enclosure of claim 27, wherein the terminal is mounted to a panel, and wherein the electrical connector and the terminal are configured to provide at least about 1 inch of clearance between the panel and the vent when the housing is mounted to the terminal such that the heat and pressure can escape the sealed interior of the housing.

29. A sealed electrical enclosure for housing a circuit breaker, comprising:
a housing have a top portion removably coupled to a bottom portion, the bottom portion made of molded plastic and having a plurality of sidewalls extending from a bottom, the housing having a sealed interior when the top portion is coupled to the bottom portion;
a first electrical connector extending from the sealed interior through the bottom of the housing, the first electrical connector being electrically coupled to a circuit breaker housed within the electrical enclosure and forming a first seal with the bottom of the housing, the first seal formed by molding the bottom portion of the housing around the first electrical connector;
an actuator extending from the sealed interior through the housing, the actuator configured to manipulate a switch of the circuit breaker and forming a second seal with the housing; and
a terminal for attachment of a wire, the terminal being electrically coupled to a second electrical connector, the second electrical connector integrally formed with at least a portion of the terminal and configured to mate with the first electrical connector to form an electrical connection between the wire and the circuit breaker;
wherein:
the first electrical connector is frictionally connected to the second electrical connector to attach the housing to the terminal;
the first and second electrical connectors are configured to be connected and disconnected to attach and remove the housing to and from the terminal without removing the wire from the terminal; and
the first electrical connector is configured to be disconnected from the second electrical connector by pulling the bottom portion of the housing in a direction away from the terminal.

* * * * *